(12) United States Patent
Kim et al.

(10) Patent No.: US 7,728,327 B2
(45) Date of Patent: Jun. 1, 2010

(54) 2-TERMINAL SEMICONDUCTOR DEVICE USING ABRUPT METAL-INSULATOR TRANSITION SEMICONDUCTOR MATERIAL

(75) Inventors: Hyun Tak Kim, Daejeon (KR); Doo Hyeb Youn, Daejeon (KR); Byung Gyu Chae, Daejeon (KR); Kwang Yong Kang, Daejeon (KR); Yong Sik Lim, Chungcheongbuk-do (KR); Gyungock Kim, Seoul (KR); Sunglyul Maeng, Chungcheongbuk-do (KR); Seong Hyun Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 541 days.

(21) Appl. No.: 11/011,878

(22) Filed: Dec. 13, 2004

(65) Prior Publication Data

US 2006/0011942 A1    Jan. 19, 2006

(30) Foreign Application Priority Data

Jul. 15, 2004    (KR) ............... 10-2004-0055096

(51) Int. Cl.
*H01L 29/04* (2006.01)
(52) U.S. Cl. .......... 257/49; 257/E49.001; 257/E49.002; 438/95
(58) Field of Classification Search .......... 257/49, 257/E49.001, E49.002; 438/95
See application file for complete search history.

(56) References Cited

U.S. PATENT DOCUMENTS 5,687,112 A    11/1997    Ovshinsky
6,087,674 A *   7/2000    Ovshinsky et al. ........... 257/2
6,121,642 A     9/2000    Newns
6,624,463 B2    9/2003    Kim et al.
6,638,820 B2 * 10/2003    Moore ........................ 438/256
2003/0054615 A1*  3/2003  Kim et al. .................... 438/310
2003/0155602 A1*  8/2003  Krieger et al. ............... 257/306
2003/0156447 A1*  8/2003  Kozicki ....................... 365/151

(Continued)

FOREIGN PATENT DOCUMENTS

JP    09-129839    5/1997

(Continued)

OTHER PUBLICATIONS

Zhou, C., "A Field Effect Transistor Based on the Mott Transition in a Molecular Layer", Appl Phys. Lett. 70 (No. 5) pp. 598-600 (Feb. 3, 1997).*

(Continued)

*Primary Examiner*—Leonardo Andújar
*Assistant Examiner*—Christopher M Roland
(74) *Attorney, Agent, or Firm*—Blakely, Sokoloff, Taylor & Zafman

(57) ABSTRACT

Provided is a 2-terminal semiconductor device that uses an abrupt MIT semiconductor material layer. The 2-terminal semiconductor device includes a first electrode layer, an abrupt MIT semiconductor organic or inorganic material layer having an energy gap less than 2eV and holes in a hole level disposed on the first electrode layer, and a second electrode layer disposed on the abrupt MIT semiconductor organic or inorganic material layer. An abrupt MIT is generated in the abrupt MIT semiconductor material layer by a field applied between the first electrode layer and the second electrode layer.

4 Claims, 21 Drawing Sheets

U.S. PATENT DOCUMENTS

| | | | |
|---|---|---|---|
| 2003/0173612 A1* | 9/2003 | Krieger et al. | 257/304 |
| 2003/0178660 A1* | 9/2003 | Schmid et al. | 257/296 |
| 2004/0178414 A1* | 9/2004 | Frey et al. | 257/79 |
| 2005/0139867 A1* | 6/2005 | Saito et al. | 257/213 |
| 2008/0197916 A1* | 8/2008 | Kim et al. | 327/551 |
| 2009/0114896 A1* | 5/2009 | Kim et al. | 257/2 |
| 2009/0230428 A1* | 9/2009 | Youn et al. | 257/192 |
| 2009/0230940 A1* | 9/2009 | Lim et al. | 323/304 |

FOREIGN PATENT DOCUMENTS

| | | | |
|---|---|---|---|
| JP | 10-056177 | | 2/1998 |
| JP | 11163365 A | * | 6/1999 |
| KR | 1020030024145 A | | 3/2003 |

OTHER PUBLICATIONS

Torrance, J. B., "The Difference between Metallic and Insulating Salts of Tetracyanoquinodimethane (TCNQ): How to Design an Organic Metal", Acc. Chem. Res. 12, 79 pp. 79-86 (1979).*

Mott, N.F. "Metal-Insulator Transition". Review of Modern Physics, vol. 40, #4, pp. 677-683 (Oct. 1968).*

Machine English Translation of JP11-163365.*

"Strong hybridization in vanadium oxides: evidence from photoemission and absorption spectroscopy", 1998 IOP Publishing Ltd., pp. 5697-5716.

A field effect transistor based on the Mott transition in a molecular layer, C. Zhou, et al., Appl Phys. Lett 70, Feb. 3, 1997, 1997 American Institute of Physics.

"Mott transition field effect transistor", D. M. Newns, et al, 1998 American Institute of Physics, Applied Physics Letters, vol. 73, No. 6, Aug. 10, 1998.

"Extended Brinkman-Rice Picture and Its Application to High-Tc Superconductors", H. Kim, pp. 1-17.

"Mechanism and observation of Mott transition in Vo2-based two- and three-terminal devices", H. Kim, et al., Ne Journal of Physics 6, New Journal of Physics.

Beck A et al: "Reproducible switching effect in thin oxide films for memory applications" Aoolied Physics Leeters, AIP, American Institute of Physics, Melville, NY, vol. 77 No. 1, Jul. 1, 2000, pp. 139-141.

Newns, D. M., et al., "Mott Transition Field Effect Transistor", *American Institute of Physics* vol. 73, No. 6, Aug. 10, 1998, (Jun. 8, 1998), 1-3.

\* cited by examiner

2-TERMINAL SEMICONDUCTOR DEVICE USING ABRUPT METAL-INSULATOR TRANSITION SEMICONDUCTOR MATERIAL

BACKGROUND OF THE INVENTION

This application claims the priority of Korean Patent Application No. 2004-55096, filed on Jul. 15, 2004, in the Korean Intellectual Property Office, the disclosure of which is incorporated herein in its entirety by reference.

1. Field of the Invention

The present invention relates to a semiconductor device and a method of manufacturing the same, and more particularly, to a 2-terminal semiconductor device that uses an abrupt metal-insulator transition (MIT) semiconductor material and a method of manufacturing the same.

2. Description of the Related Art

Recently, a memory device using a structural phase transition material has drawn interest and research and development regarding this memory device has been actively performed. An example of the memory device using a structural phase material has been disclosed in U.S. Pat. No. 5,687,112. The memory device disclosed is a phase change memory (PCM) device that uses a crystalline phase and an amorphous phase occurring at a high temperature. This device can be used as a memory device since it can use a phase change according to the structural phase transition. However, the device cannot be used for other applications, such as a switching device, because a rapid switching speed cannot be implemented due to the location change of atoms according to the structural phase transition. If a rapid switching speed is forced, the memory device may break due to a hysteresis phenomenon. A drawback of the phase change memory device is its limited applications.

On the other hand, a consecutive metal-insulator transistor, that is, a Mott-Hubbard field transistor which uses a Mott-Hubbard insulator in an insulator that allows a second transition has been suggested as a semiconductor device that uses a metal-insulator transition. The Mott-Hubbard field transistor has been disclosed by D. M. Newns, J. A. Misewich, C. C. Tsuei, A. Gupta, B. A. Scott, A. Schrott, in Appl. Phys. Lett. 73 (1998) 780. The Mott-Hubbard field transistor performs an ON/OFF operation according to the metal-insulator transition. Unlike the conventional MOS field transistor, the integration density of this transistor can be significantly improved since a depletion layer does not exist. Also, the Mott-Hubbard field transistor has higher speed switching characteristic than the MOS field transistor. However, charges to be used for carriers must be added until the Mott-Hubbard field transistor reaches the characteristic of a metal since Mott-Hubbard field transistor uses MIT that is consecutively generated. Accordingly, the charges added must have high concentration, and a dielectric constant of a gate insulating layer must be high, the thickness of the gate insulating layer must be thin, and a gate voltage applied must be greater than the high concentration of the added charge. However, if the dielectric constant is too high, the lifetime of the transistor is reduced since the fatigue characteristic of the dielectric may go badly at a high switching speed. There is a process limit to make a thin insulator. Also, when the gate voltage is high, there is a drawback of high power consumption.

To solve these problems, a switching field transistor that uses an abrupt MIT semiconductor material, not a consecutive transition, has been disclosed in U.S. Pat. No. 6,624,463. The abrupt MIT semiconductor material has a characteristic in that a transition from an insulator to a metal takes place rapidly not consecutively by adding a low concentration of holes to a Mott-Brinkman-Rice insulator. The Hole-driven metal-insulatr transition theory has been disclosed in the article "New Trends in Superconductivity" by Hyun-Tak Kim published in NATO Science Series Vol II/67 (Kluwer, 2002) pp. 137 and at the web address http://xxx.lanl.gow/abs/cond-mat/0110112. Hyun-Tak Kim, Byung-Gyu Chae, Doo-Hyeb Youn, Sung-Lyul Maeng, Gyungock Kim, Kwang-Yong Kang, and Yong-Sik Lim in New Journal of Physics 6 (2004) 52 has also disclosed a research about the abrupt MIT by using vanadium dioxide ($VO_2$) which is a representative Mott-Brinkman-Rice insulator. The problems of the field transistor using the consecutive metal-insulator transition material are solved in the switching field transistor since the concentration of the holes added is very low. However, the availability of the abrupt MIT semiconductor materials is limited and the cost of forming an abrupt MIT semiconductor material layer is high.

SUMMARY OF THE INVENTION

The present invention provides a 2-terminal semiconductor device that uses an abrupt MIT semiconductor material that can be formed readily with a low cost without generating a structural phase transition.

The present invention also provides a method of manufacturing a 2-terminal semiconductor device that uses an abrupt MIT semiconductor material.

The semiconductor in the present invention is a material having an energy gap less than 2 eV and a hole level or an electronic level and acting as an insulator at low temperatures. The hole level denotes that the material has holes and the electronic level denotes that the material has electrons, and the material includes organic and inorganic materials.

According to an aspect of the present invention, there is provided a 2-terminal semiconductor device comprising: a first electrode layer as a substrate, an abrupt MIT organic or inorganic semiconductor material layer disposed on the first electrode, and a second electrode layer disposed on the abrupt MIT organic or inorganic semiconductor material layer.

The abrupt MIT semiconductor material layer can include an individual p-type semiconductor of Si, Ge, Al, As, Sb, B, N, Ga, P, In, Te, Ag, Cd, Zn, Pb, S, Bi, K, H, Be, O or C to which a low concentration of holes is added or a compound semiconductor composed of these elements.

The abrupt MIT semiconductor material layer can include an individual p-type semiconductor of Y, Pr, Ba, Cu, La, Sr, Ti, V, Ca, Fe, W, Mo, Nb, Al, Hf, Ta, Zr, La, Bi, Pd, or O to which a low concentration of holes is added or a compound semiconductor composed of these elements.

The abrupt MIT semiconductor material layer can include an individual p-type semiconductor of Fe, S, Sm, Se, Te, Eu, Si, Mn, Co, B, H, Li, Ca, Y, Ru, Os, P, As, P, Ir, Ti, Zr, Hf, Mo, Te, Tc, Re, Rh, Pt, Yb, B, O or C, transition elements, earth elements, and lanthanides to which a low concentration of holes is added or a compound semiconductor composed of these elements.

The abrupt MIT semiconductor material layer may include inorganic compound semiconductors that include p-type semiconductors to which a low concentration of holes is added, p-type oxide semiconductors to which a low concentration of hole is added, p-type semiconductor elements (III-V and II-VI family) to which a low concentration of holes is added, transition metal elements, earth elements, lanthanides, p-type organic semiconductor to which a low concentration of holes is added, and insulators.

The p-type semiconductor to which a low concentration of holes is added can include Si(100), Si(111), Si(110), Si:B, Si:P, Ge(100), SiC, SiGe, AlAs, InAlAs, AlSb, BN, GaAs, InGaAs, GaP, GaSb, $Ga_xSb_{1-x}$ ($0 \leq x \leq 0.5$), $Ge_xSb_{1-x}$ ($0 \leq x \leq 0.2$), InN, InAs, InP, InSb, $In_xSb_{1-x}$ ($0 \leq x \leq 0.5$), $Ge_aIn_bSb_cTe_d$ ($0 \leq a \leq 0.2$, $0 \leq b \leq 0.2$, $0.5 \leq c \leq 1$, $0 \leq d \leq 0.5$), $In_xSb_yTe_z$ ($0 \leq x \leq 0.2$, $0.5 \leq y \leq 1$, $0 \leq z \leq 0.3$), $Ag_aIn_bSb_cTe_d$ ($0 \leq a \leq 0.2$, $0 \leq b \leq 0.2$, $0.5 \leq c \leq 1$, $0 \leq d \leq 0.5$), $Te_aGe_bSn_cAu_d$ ($0.5 \leq a \leq 1$, $0 \leq b \leq 0.2$, $0 \leq c \leq 0.3$, $0 \leq d \leq 0.5$), $AgSbTe_2$, $AgInTe_2$, GeCdS, CdSe, CdTe, ZnS, ZnSe, ZnTe, PbS, PbSe, PbTe, Grey Sn, Grey Se, Sb, Te, $Sb_{1-x}Te_x$ ($0 \leq x \leq 0.5$), B, DAC(Diamondlike Amorphous-C), TAC(Tetrahedral Amorphous-C):N, a-C;H(Amorphous hydrogenated carbon layers, or DLC(Diamond-Like Carbon), $K_4C_{60}$, $K_6C_{60}$, Ga—As—Si system, Ga—GaAs—Ge system, Ga—GaAs—Sn, Ga—As—Sn system, Ga—As—Zn system, Ga—P—Si system, Ga—P—Zn system, Ga—P—Ge system, GaP—Bi system, GeTe—$Bi_2Te_3$, $GeSb_2Te_4$, GaP:N, GaAs:Ca, GaAs:K, GaAs:Cl, or $GeBi_2Te_4$.

The p-type oxide semiconductor to which a low concentration of holes is added can include $Y_{1-x}Pr_xBa_2Cu_3O_7$ ($0 \leq x \leq 1$), $La_{2-x}Sr_xCuO_4$ ($0 \leq x \leq 1$), $La_{2-x}Ba_xCuO_4$ ($0 \leq x \leq 1$), $Ba_{1-x}SrTiO_3$ ($0 \leq x \leq 1$), $La_{1-x}SrTiO_3$ ($0 \leq x \leq 1$), $VO_2$, $V_2O_3$, $Ca_xV_{1-x}O_2$ ($0 \leq x \leq 1$), $Al_xV_{1-x}O_2$ ($0 \leq x \leq 1$), $Ti_xV_{1-x}O_2$ ($0 \leq x \leq 1$), $Fe_xV_{1-31\ x}O_2$ ($0 \leq x \leq 1$), $W_xV_{1-x}O_2$ ($0 \leq x \leq 1$), $Mo_xV_{1-x}O_2$ ($0 \leq x \leq 1$), $Fe_3O_4$, $Nb_2O_5$, $WO_3$, $Ti_2O_3$, PdO, $Al_2O_3$, $HfO_2$, $SiO_2$, $Y_2O_3$, $Ta_2O_5$, $TiO_2$, or $ZrO_2$.

The p-type transition metal to which a low concentration of holes is added and semiconductor that includes the transition metals can include $Fe_{1-x}S$ ($0 \leq x \leq 0.5$), SmS, SmSe, SmTe, $Eu_3S_4$, $FeSi_2$, $Fe_{1-x}Mn_xSi_2$ ($0 \leq s \leq 0.5$), $Fe_{1-x}Co_xSi_2$ ($0 \leq x \leq 0.5$), B:H(9%), B:H(11%), B:H(24%), $LiAlB1_4$, $CuB_4$, $CaB_6$, a-$AlB1_2$, $YB_{66}$, $SmB_{66}$, $Mn_{11}Si_{19}$, $Mn_{26}Si_{45}$, $Mn_{15}Si_{26}$, $Ru_2Si_3$, $Fe_2Si_2$, $RuP_2$, RuPAs, $RuAs_2$, $OsP_2$, $OsAs_2$, $RhP_2$, $RhAs_2$, $IrP_2$, $IrAs_2$, $RuP_4$, FeAs, RuAsS, OsPS, OsAsS, OsPSe, $Ti_{1+x}S_2$ ($0 \leq x \leq 0.5$), $TiS_{3-x}$ ($0 \leq x \leq 0.5$), $Zr_{1+x}Se_2$ ($0.01 \leq x \leq 0.1$), $Zr_2S_3$, $ZrSe_3$, $HfSe_2$, $MoS_2$, 2H—$MoTe_{2-x}$ ($0.01 \leq x \leq 0.1$), 2H—$WSe_2$, MnTe, $TcS_2$, $TcSe_2$, $ReS_2$, $ReSe_2$, $FeS_2$, $RuS_2$, $RuSe_2$, $RhS_3$, $RhSe_2$, $RhSe_3$, $IrS_2$, $IrSe_2$, PtS, $Pt_xS_2$ ($0.9 \leq x \leq 1$), SmTe, EuTe, YbSe, YbTe or BC.

The p-type organic semiconductor to which a low concentration of holes is added can be a $D^+A^-$ type in which $D^+$ is an organic donor and $A^-$ is an organic acceptor.

In this case, the $D^+A^-$ type can include $D^+A^-$=TTF+Br, $D^+A^-$=BEDT-TTF, or $D^+A^-$=TMPD+TCNQ, wherein TTF is tetrathiofulvalene, BEDT-TTF is bis-ethylenedithio-tetrathiofulvalene, TMPD is N,N,N',N'-tetramethyl-p-phenylenediamine, and TCNQ is tetracyano-p-quinodimethane, and the TCNQ is an active component that is switching between the TCNQ- and TCNQ by injecting holes.

Also, the p-type organic semiconductor may include pentacene and its derivatives, thiophene and thiophene oligomer, benzodithiophene dimer, phthalocyanine, Poly(alkyl-thiophene), Poly(3-hexylyl-thiophene), Poly(3-octyl-thiophene), Poly(3-dodecyl-thiophene), anthradithiophene (ADT), dihexyl-ADT, didodecyl-ADT, thiophene derivatives that includes dioctadecyl-ADT, or aromatic compound.

The first electrode layer and the second electrode layer can include W, Mo, Au/Cr, Ti/N, Ti/Al/N, Ni/Cr, Al/Au, Pt, Cr/Mo/Au, $YBa_2Cu_3O_{7-d}$, or Ni/Mo/Au.

The 2-terminal semiconductor device can further comprise a resistance unit that is connected to at least one of the first electrode layer and the second electrode layer.

According to another aspect of the present invention, there is provided a 2-terminal semiconductor device comprising: a substrate, a first electrode layer disposed on the substrate, an abrupt MIT semiconductor material layer disposed on the first electrode layer, and a second electrode layer disposed on the abrupt MIT semiconductor material layer.

The substrate can include a SOI (silicon on insulator), Si, $SiO_2$, GaAs, GaSb, InP, $Al_3O_4$, plastic, glass, $V_2O_5$, $PrBa_2Cu_3O_7$, $YBa_2Cu_3O_7$, MgO, $SrTiO_3$, Nb-doped $SrTiO_3$ or an insulator.

A buffer layer disposed between the substrate and the first electrode layer may be further included.

In this case, the buffer layer can include a $SiO_2$ layer or a $Si_3N_4$ layer.

The 2-terminal semiconductor device may further comprise a resistance unit that is connected to at least one of the first electrode layer and the second electrode layer.

According to another aspect of the present invention, there is provided a 2-terminal semiconductor device comprising: a substrate, a first electrode layer disposed on the substrate, an abrupt MIT semiconductor material layer disposed on the first electrode layer, a second electrode layer disposed on the abrupt MIT semiconductor material layer, and a gate insulating layer disposed at least one of both surfaces of the abrupt MIT semiconductor material layer.

According to another aspect of the present invention, there is provided a 2-terminal semiconductor device comprising a substrate, a first electrode layer disposed on the substrate, an abrupt MIT semiconductor material layer disposed on the first electrode layer, a second electrode layer disposed on the abrupt MIT semiconductor material layer, and a ferromagnetic thin layer disposed at least one of both surfaces of the abrupt MIT semiconductor material layer.

According to another aspect of the present invention, there is provided a 2-terminal semiconductor device comprising a substrate, an abrupt MIT semiconductor material layer disposed on the substrate, and a first electrode layer and a second electrode layer disposed apart facing each other on the abrupt MIT semiconductor material layer.

The 2-terminal semiconductor device may further comprise a buffer layer disposed between the substrate and the abrupt MIT semiconductor material layer.

The 2-terminal semiconductor device may further comprise a resistance unit that is connected to at least one of the first electrode layer and the second electrode layer.

The first electrode layer and the second electrode layer can be formed in a finger shape.

According to another aspect of the present invention, there is provided a 2-terminal semiconductor device comprising a substrate, an abrupt MIT semiconductor material layer disposed on the substrate, a first electrode layer and a second electrode layer disposed from and facing each other on the abrupt MIT semiconductor material layer, and a gate insulating layer disposed on the abrupt MIT semiconductor material layer between the first electrode layer and the second electrode layer.

According to another aspect of the present invention, there is provided a 2-terminal semiconductor device comprising: a substrate, an abrupt MIT semiconductor material layer disposed on the substrate, a first electrode layer and a second electrode layer disposed apart facing each other on the abrupt MIT semiconductor material layer, and a ferromagnetic thin layer disposed on the abrupt MIT semiconductor material layer between the first electrode layer and the second electrode layer.

According to another aspect of the present invention, there is provided a method of manufacturing a 2-terminal semiconductor device, comprising: forming a first electrode layer on a substrate, forming an abrupt MIT semiconductor material layer disposed on the first electrode layer, and forming a second electrode layer on the abrupt MIT semiconductor material layer.

The forming of the first electrode layer and the second electrode layer can be performed by a sputtering method.

The forming of the abrupt MIT semiconductor material layer can be performed by using a pulse laser method.

The forming of the abrupt MIT semiconductor material layer can be performed by using a molecular beam epitaxy method.

The method may further comprise forming a buffer layer on the substrate before forming the abrupt MIT semiconductor material layer.

According to another aspect of the present invention, there is provided a method of manufacturing a 2-terminal semiconductor device, comprising forming an abrupt MIT semiconductor material layer on a substrate, forming a metal layer on the abrupt MIT semiconductor material layer, and forming a first electrode layer and a second electrode layer disposed to face each other and having an exposed surface therebetween after exposing a portion of the abrupt MIT semiconductor material layer by patterning the metal layer.

The method may further comprise forming a buffer layer on the substrate before forming the abrupt MIT semiconductor material layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown. However, this invention may be embodied in many different forms and should not be construed as being limited to the embodiments set forth herein.

Figure 1:
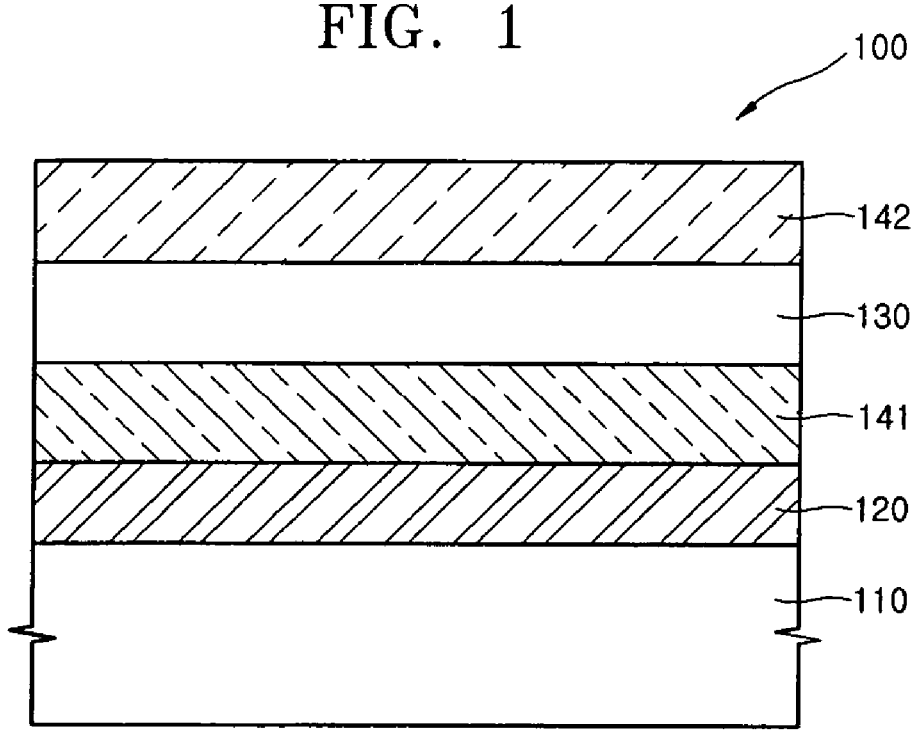
FIG. 1 is a cross-sectional view illustrating a 2-terminal semiconductor device that uses an abrupt MIT semiconductor material according to an embodiment of the present invention.

FIG. 1 is a cross-sectional view illustrating a 2-terminal semiconductor device 100 that uses an abrupt MIT semiconductor material according to an embodiment of the present invention.

Referring to FIG. 1, the 2-terminal semiconductor device 100 has a stacking structure in which a current flows in a vertical direction and includes sequentially stacked a buffer layer 120, a first electrode layer 141, an abrupt MIT semiconductor material layer 130, and a second electrode layer 142 on a substrate 110. In some cases, the substrate 110, the buffer layer 120, and the first electrode layer 141 can be formed of a single layer. In this case, the first electrode layer 141 acts as a substrate without the substrate 110 and the buffer layer 120.

Also, in some cases, a gate insulating layer or a ferromagnetic thin layer can be disposed at least one of the both surfaces of the abrupt MIT semiconductor material layer 130.

There is no specific limitation of materials for forming the substrate 110 and can be formed of Si, $SiO_2$, GaAs, $Al_3O_4$, plastics, glass, $V_2O_5$, $PrBa_2Cu_3O_7$, $YBa_2Cu_3O_7$, MgO, $SrTiO_3$, $SrTiO_3$ doped with Nb, or Silicon-On-Insulator (SOI). The buffer 120 is disposed on the substrate 110 for well growing the first electrode layer 141, but it can be omitted in some cases. The buffer layer 120 is formed of a material that can control a lattice constant of the substrate 110 and the first electrode layer 141 and can be formed of a $SiO_2$ layer or a $Si_3N_4$ layer.

The abrupt MIT semiconductor material layer 130 denotes a thin layer formed of a semiconductor material wherein an abrupt MIT can take place when holes in a low concentration are added. Here, the low hole concentration n is given approximately $(0.2/a_H)^3$ in the consideration of the Mott criterion, where $a_H$ is Bohr radius of a material. For example, the hole concentration n of a vanadium oxide layer $VO_2$ having an energy gap of 0.6 eV and a hole level is approximately no 0.0018%, that is, $n \approx 3 \times 10^{18} cm^{-3}$. The abrupt MIT semiconductor material layer 130, such as the $VO_2$ layer, is formed of a material having an energy gap of less than 2 eV and hole in the hole level. As another example, the hole concentration n of p-type GaAs having an energy gap of 1.45 and a hole level is approximately $n \approx 0.001\%$, that is, $n \approx 1 \times 10^{14} cm^{-3}$. The theory of hole-driven metal-insulator transition by adding a low concentration of holes has disclosed in the article of "New Trends in Superconductivity" by Hyun-Tak Kim published in NATO Science Series Vol II/67 (Kluwer, 2002) p137 or http://xxx.lanl.qov/abs/cond-mat/0110112. The resultant equation is show in FIG. 4. Here, the hole level denotes an energy level in which the holes exist in a constraint state. A n-type semiconductor with a high resistance can also be used as the abrupt MIT semiconductor material layer 130.

The abrupt MIT semiconductor material layer 130 includes p-type semiconductor Si, Ge, Al, As, Sb, B, N, Ga, P, In, Te, Ag, Cd, Zn, Pb, S, Bi, K, H, Be, O or C to which a low concentration of holes is added, an individual element, or p-type compound semiconductors composed of these elements. The abrupt MIT semiconductor material layer 130 also includes p-type oxide semiconductor to which a low concentration of holes are added, such as the elements of Y, Pr, Ba, Cu, La, Sr, Ti, V, Ca, Fe, W, Mo, Nb, Al, Hf, Ta, Zr, La, Pd, O and oxide semiconductor composed of these elements, and Fe, S, Sm, Se, Te, Eu, Si, Mn, Co, B, H, Li, Ca, Y, Ru, Os, P, As, P, Ir, Ti, Zr, Hf, Mo, Te, Tc, Re, Rh, Pt, Yb, Ce, Pr, Nd, Pm, Sm, Eu. Gd, Tb, Dy, Ho, Er, Tm, Lu, O or elements of C, rare earth, and lanthanide, or compound semiconductors composed of these elements.

When classified in a different manner, the abrupt MIT semiconductor material layer 130 includes inorganic compound semiconductors that include a p-type semiconductor to which a low concentration of holes is added, a p-type oxide semiconductor to which a low concentration of holes is added, p-type semiconductor elements (III-V and II-V family), transition metal elements, earth elements, and lanthanide elements to which a low concentration of holes are added or p-type organic semiconductor and insulator to which a low concentration of holes a re added.

The p-type semiconductors to which a very low concentration of holes is added include Si(100), Si(111), Si(110), Si:B, Si:P, Ge(100), SiC, SiGe, AlAs, InAlAs, AlSb, BN, GaAs, InGaAs, GaP, GaSb, $Ga_xSb_{1-x}$ ($0 \leq x \leq 0.5$), $Ge_xSb_{1-x}$ ($0 \leq x \leq 0.2$), InN, InAs, InP, InSb, $In_xSb_{1-x}$ ($0 \leq x \leq 0.5$), $Ge_aIn_bSb_cTe_d$ ($0 \leq a \leq 0.2$, $0 \leq b \leq 0.2$, $0.5 \leq c \leq 1$, $0 \leq d \leq 0.5$), $In_xSb_yTe_z$ ($0 \leq x \leq 0.2$, $0.5 \leq y \leq 1$, $0 \leq z \leq 0.3$), $Ag_aIn_bSb_cTe_d$ ($0 \leq a \leq 0.2$, $0 \leq b \leq 0.2$, $0.5 \leq c \leq 1$, $0 \leq d \leq 0.5$), $Te_aGe_bSn_cAu_d$ ($0.5 \leq a \leq 1$, $0 \leq b \leq 0.2$, $0 \leq c \leq 0.3$, $0 \leq d \leq 0.5$), $AgSbTe_2$, $AgInTe_2$, GeCdS, CdSe, CdTe, ZnS, ZnSe, ZnTe, PbS, PbSe, PbTe, Grey Sn, Grey Se, Sb, Te, $Sb_{1-x}Te_x$ ($0 \leq x \leq 0.5$), B, DAC(Diamondlike Amorphous-C), TAC(Tetrahedral Amorphous-C):N, a-C;H(Amorphous hydrogenated carbon layers, or DLC(Diamond-Like Carbon), $K_4C_{60}$, $K_6C_{60}$, Ga—As—Si system, Ga—GaAs—Ge system, Ga—GaAs—Sn, Ga—As—Sn system, Ga—As—Zn system, Ga—P—Si system, Ga—P—Zn system, Ga—P—Ge system, GaP—Bi system, $GeTe-Bi_2Te_3$, $GeSb_2Te_4$, GaP:N, GaAs:Ca, GaAs:K, GaAs:Cl, or $GeBi_2Te_4$.

The p-type oxide semiconductors to which a very low concentration of holes are added include $Y_{1-x}Pr_xBa_2Cu_3O_7$ ($0 \leq x \leq 1$), $La_{2-x}Sr_xCuO_4$ ($0 \leq x \leq 1$), $La_{2-x}Ba_xCuO_4$ ($0 \leq x \leq 1$), $Ba_{1-x}SrTiO_3$ ($0 \leq x \leq 1$), $La_{1-x}SrTiO_3$ ($0 \leq x \leq 1$), $VO_2$, $V_2O_3$, $Ca_xV_{1-x}O_2$ ($0 \leq x \leq 1$), $Al_xV_{1-x}O_2$ ($0 \leq x \leq 1$), $Ti_xV_{1-x}O_2$ ($0 \leq x \leq 1$), $Fe_xV_{1-x}O_2$ ($0 \leq x \leq 1$), $W_xV_{1-x}O_2$ ($0 \leq x \leq 1$), $Mo_xV_{1-x}O_2$ ($0 \leq x \leq 1$), $Fe_3O_4$, $Nb_2O_5$, $WO_3$, $Ti_2O_3$, PdO, $Al_2O_3$, $HfO_2$, $SiO_2$, $Y_2O_3$, $Ta_2O_5$, $TiO_2$, or $ZrO_2$.

A semiconductor which includes a p-type transition metal to which a low concentration of holes is added includes $Fe_{1-x}S$ ($0 \leq x \leq 0.5$), SmS, SmSe, SmTe, $Eu_3S_4$, $FeSi_2$, $Fe_{1-x}Mn_xSi_2$ ($0 \leq x \leq 0.5$), $Fe_{1-x}Co_xSi_2$ ($0 \leq x \leq 0.5$), B:H(9%), B:H(11%), B:H(24%), $LiAlB_{14}$, $CuB_4$, $CaB_6$, a-$AlB_{12}$, $YB_{66}$, $SmB_{66}$, $Mn_{11}Si_{19}$, $Mn_{26}Si_{45}$, $Mn_{15}Si_{26}$, $Ru_2Si_3$, $Fe_2Si_2$, $RuP_2$, $RuPAs$, $RuAs_2$, $OSP_2$, $OsAs_2$, $RhP_2$, $RhAs_2$, $IrP_2$, $IrAs_2$, $RuP_4$, FeAs, RuAsS, OsPS, OsAsS, OsPSe, $Ti_{1+x}S_2$ ($0 \leq x \leq 0.5$), $TiS_{3-x}$ ($0 \leq x \leq 0.5$), $Zr_{1+x}Se_2$ ($0.01 \leq x \leq 0.1$), $Zr_2S_3$, $ZrSe_3$, $HfSe_2$, $MOS_2$, 2H—$MoTe_{2-x}$ ($0.01 \leq x \leq 0.1$), 2H—$WSe_2$, MnTe, $TcS_2$, $TcSe_2$, $ReS_2$, $ReSe_2$, $FeS_2$, $RuS_2$, $RuSe_2$, $RhS_3$, $RhSe_2$, $RhSe_3$, $IrS_2$, $IrSe_2$, PtS, $Pt_xS_2$ ($0.9 \leq x \leq 1$), SmTe, EuTe, YbSe, YbTe, or BC.

The p-type organic semiconductor to which a very low concentration of holes is added is a $D^+A^-$ type in which $D^+$ is an organic donor and $A^-$ is an organic acceptor, and include $D^+A^-$=TTF+Br, $D^+A^-$=BEDT-TTF, or $D^+A^-$=TMPD+TCNQ. Here, TTF is tetrathiofulvalene, BEDT-TTF is bis-ethylenedithio-tetrathiofulvalene, TMPD is N,N,N',N'-tetramethyl-p-phenylenediamine, and TCNQ is tetracyano-p-quinodimethane. And, the TCNQ is an active component that switches between the TCNQ- and TCNQ by injecting holes.

Also, the p-type organic semiconductor includes pentacene and its derivatives, thiophene and thiophene oligomer, benzodithiophene dimer, phthalocyanine, Poly(alkyl-thiophene), Poly(3-hexylyl-thiophene), Poly(3-octyl-thiophene), Poly(3-dodecyl-thiophene), anthradithiophene (ADT), dihexyl-ADT, didodecyl-ADT, thiophene derivatives that includes dioctadecyl-ADT, aromatic compound, or organic compound.

The first and second electrode layers 141 and 142 include W, Mo, Au/Cr, Ti/N, Ti/Al/N, Ni/Cr, Al/Au, Pt, Cr/Mo/Au, $YBa_2Cu_3O_{7-d}$, or Ni/Mo/Au.

The operation of a semiconductor device structure that uses an abrupt MIT semiconductor material will now be described. When a predetermined intensity of bias is applied to the first and second electrode layers 141 and 142, a field of a predetermined magnitude is formed on both ends of the abrupt MIT semiconductor material layer 130. Then, a hole doping phenomenon occurs due to the field, that is, the holes existed in the hole level of the abrupt MIT semiconductor material layer 130 are injected into a valence band. The abrupt MIT semiconductor material layer 130 transitions to a metal from an insulator according to the doping phenomenon, and as a result, a current flows between the first and the second electrode layers 141 and 142.

A method of manufacturing the 2-terminal semiconductor device 100 that uses an abrupt MIT semiconductor material having a stacking structure will now be described. First, a buffer layer 120, such as a titanium (Ti) layer, is formed on the semiconductor substrate 110 such as a silicon substrate, and the first electrode 141 formed of a platinum (Pt) thin layer as a lower electrode is formed on the buffer layer 120. The Pt thin layer can be formed by a sputtering method. Next, the abrupt MIT semiconductor material layer 130 is formed of a $VO_2$ layer. The $VO_2$ layer can be deposited by a pulse laser method. In some cases, the abrupt MIT semiconductor material layer 130 can be formed by a Molecular Beam Epitaxy method. Next, the second electrode 142 formed of an Au/Cr layer is formed on the abrupt MIT semiconductor material layer 130 using a sputtering method.

Figure 2:
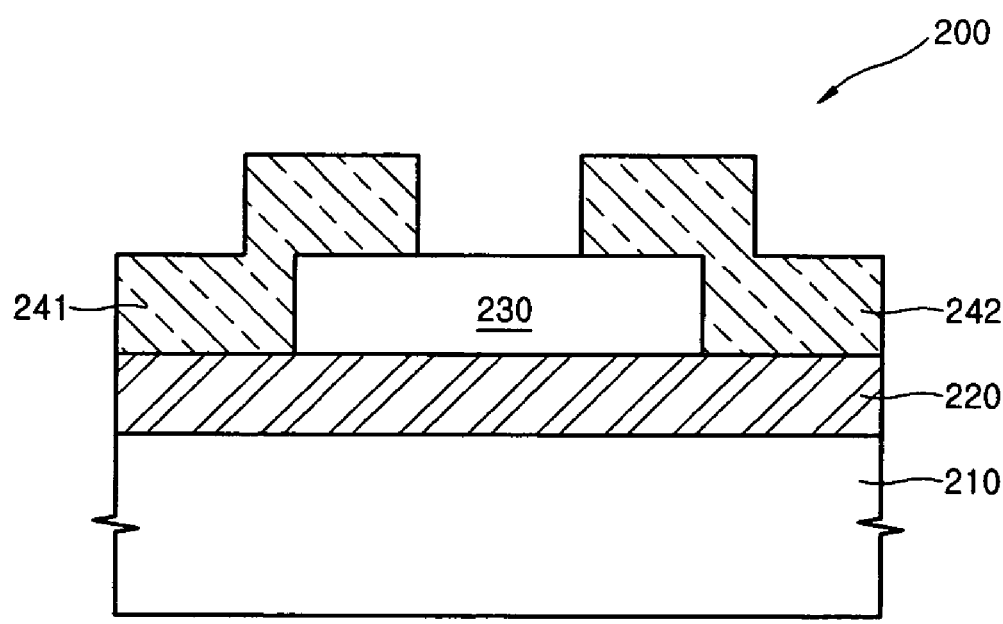
FIG. 2 is a cross-sectional view illustrating a 2-terminal semiconductor device that uses an abrupt MIT semiconductor material according to another embodiment of the present invention.

FIG. 2 is a cross-sectional view illustrating a 2-terminal semiconductor device 200 that uses an abrupt MIT semiconductor material according to another embodiment of the present invention.

Referring to FIG. 2, the 2-terminal semiconductor device 200 has a plane structure in which a current flows in a horizontal direction and has a buffer layer 220 disposed on a substrate 210 and an abrupt MIT semiconductor material layer pattern 230 on the buffer layer 220. The abrupt MIT semiconductor material layer pattern 230 is disposed on a portion of a surface of the buffer layer 220. A first electrode layer 241 and a second electrode layer 242 are disposed by a predetermined distance apart from each other on the abrupt MIT semiconductor material layer pattern 230. In some cases, a gate insulating layer or a ferromagnetic thin layer can be interposed between the first electrode layer 241 and the second electrode layer 242.

The operation of the 2-terminal semiconductor device 200 having a plane structure is identical to the operation of the 2-terminal semiconductor device 100 having a stacking structure of FIG. 1 except the direction of a current flow that is horizontal due to the transition the abrupt MIT semiconductor material layer pattern 230 to a metal.

A method of manufacturing the 2-terminal semiconductor device 200 that uses an abrupt MIT semiconductor material layer pattern 230 having a plane structure will now be described. First, the buffer layer 220 formed of Ti layer is formed on the semiconductor substrate 210 and the abrupt MIT semiconductor material layer 130 is formed using a $VO_2$ layer on the buffer layer 220. Next, after exposing a portion of a surface of the buffer layer 220 by patterning the abrupt MIT semiconductor material layer 130, a metal layer (not shown) is formed on the entire surface of the buffer layer 220. Afterward, a mask layer pattern (not shown) is formed on the metal layer and an etching process using the mask layer pattern removes an exposed portion of the metal layer. Then, a portion of a surface of the abrupt MIT semiconductor material layer 130 used as a channel region is exposed and the first electrode layer 241 and the second electrode layer 242 are formed on both sides of the exposed portion of the abrupt MIT semiconductor material layer 130. Next, the mask layer pattern is removed.

Figure 3:
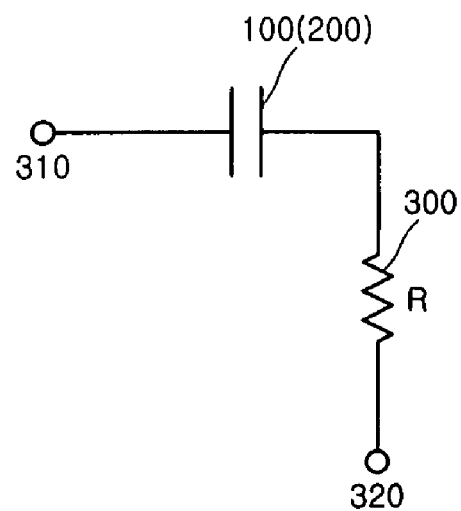
FIG. 3 is a 2-terminal network circuit diagram including a 2-terminal semiconductor device that uses an abrupt MIT semiconductor material according to the present invention.

FIG. 3 is a 2-terminal network circuit diagram including a 2-terminal semiconductor device that uses an abrupt MIT semiconductor material according to the present invention.

Referring to FIG. 3, one electrode of a 2-terminal semiconductor device 100 or 200 that uses the abrupt MIT semiconductor material having either a stacking structure or a plane structure, such as the first electrode layer 141 or 241, is connected to a first terminal 310 and the other electrode, such as the second electrode layer 142 or 242, is connected to a second terminal 320 by interposing a resistance unit 300. The resistance unit 300 has a resistance value R large enough to prevent the failure of the 2-terminal semiconductor device 100 or 200 due to a high current. Connecting it to a transistor or a power source uses the 2-terminal network circuit.

Figure 4:
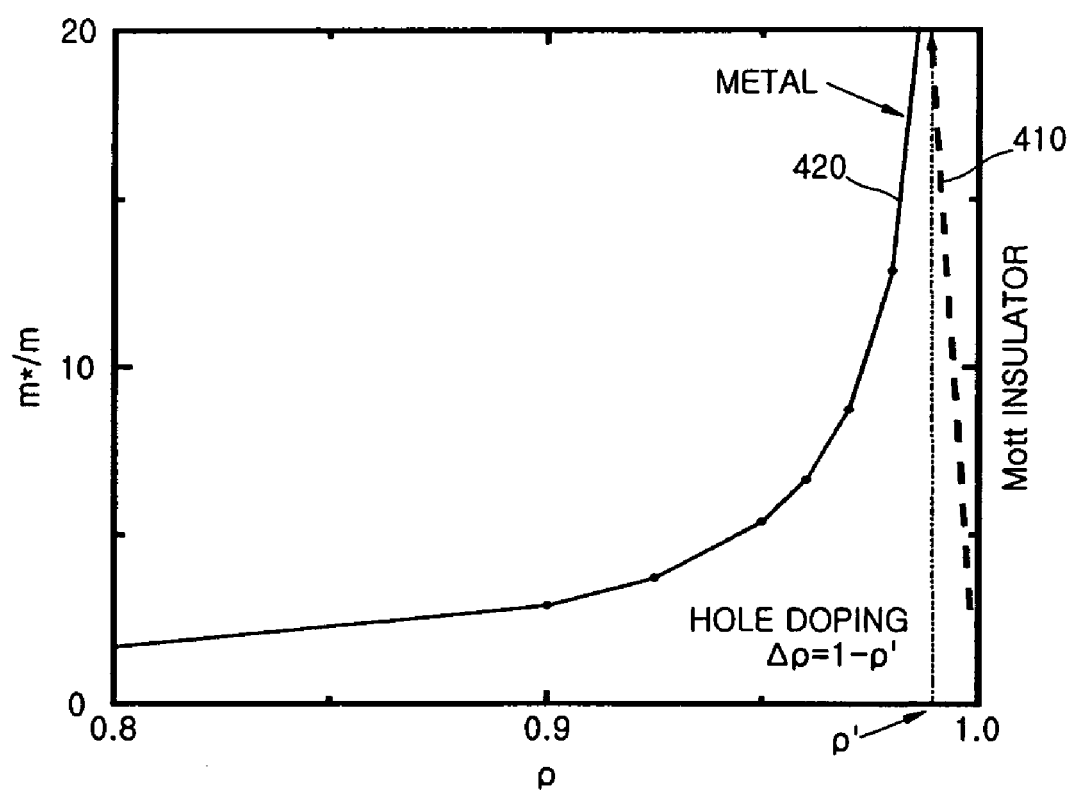
FIG. 4 is a graph showing an effect of hole doping in the abrupt MIT semiconductor material of FIGS. 1 and 2.

FIG. 4 is a graph showing an effect of hole doping in the abrupt MIT semiconductor material of FIGS. 1 and 2. The inner curve of the graph is given by equation $m^*/m=1/(1-\rho^4)$, where $m^*$ is effective mass and p is band filling factor of a carrier in a metal. Electric conductivity a is proportional to $(m^*/m)^2$. The relationship-type of the factors is disclosed in the article "New Trends in Superconductivity" by Hyun-Tak Kim published in NATO Science Series Vol II/67 (Kluwer, 2002) pp. 137 and at the web address http://xxx.lanl.gov/abs/cond-mat/0110112.

Referring to FIG. 4, in the case of a Mott-Brinkman-Rice insulator (Mott insulator) which is not a metal although the number of electrons is equal to the number of the atoms, the Mott-Brinkman-Rice insulator transition to a metal from an insulator when a band filling factor p, which is a ratio of the number of atoms to the number of electrons, is less than 1, that is, a hole doping occurs. The reduction of the band filling factor p in a Mott-Brinkman-Rice insulator from 1 to less than 1 denotes that a hole doping has occurred. In FIG. 4, a dotted line indicated by reference number 410 denotes an insulator that rapidly jumps to a metal and a line indicated by reference number 420 denotes the effective mass $m^*/m$ of electrons in a metal state after transitioning to the metal. It is well known that electric conductivity is proportional to the square of the effective mass $m^*/m$ of the electrons in a metal state. Accordingly, if a very low concentration of holes is doped to the Mott-Brinkman-Rice insulator, the insulator transitions to a metal. In this case, as the amount of holes that generate the hole doping increases, the degree of jumping is decreased and a low electric conductivity is implemented. On the contrary, as the amount of holes added is decreased, the degree of jumping increases and a high electric conductivity is implemented. Conventionally, a semiconductor has been interpreted not as a Mott-Brinkman-Rice insulator. However, considering the characteristics of the Mott-Brinkman-Rice insulator disclosed in the aforementioned theory wherein a semiconductor material also has an energy gap less than 2 eV and a hole level or an electronic level, a 2-terminal semiconductor device can be manufactured.

Figure 5:
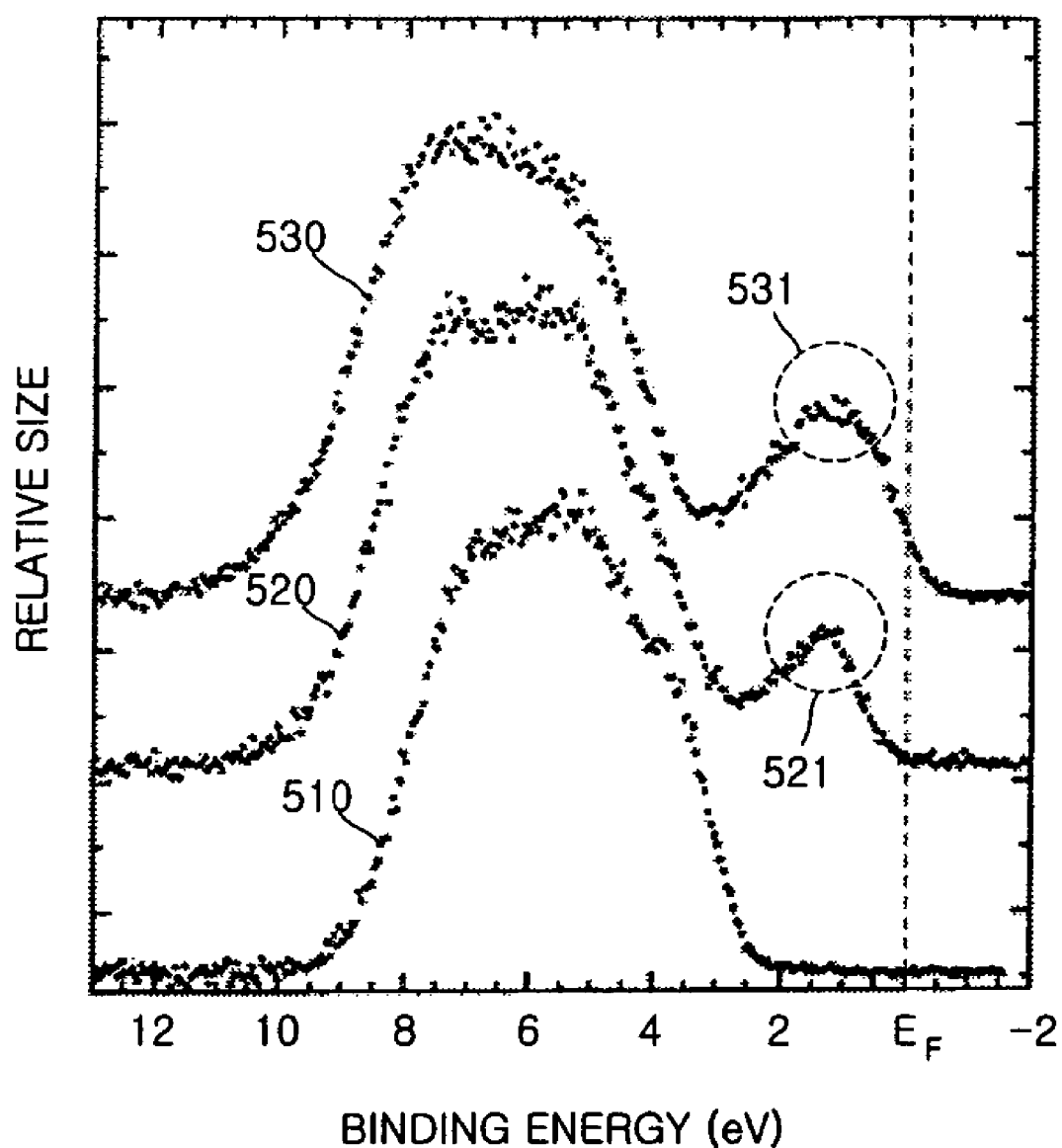
FIG. 5 is a graph showing the existence of a sub-gap less than 2 eV in the abrupt MIT semiconductor material of FIGS. 1 and 2.

FIG. 5 is a graph showing the existence of a sub-gap less than 2 eV in the abrupt MIT semiconductor material of FIGS. 1 and 2. This is photoemission spectroscopy data disclosed by R. Zimmermann, R. Claessed, F. Reinert, P. Steiner, S. Hufner, in J. Phys.: Condens. Matter 10 (1998) 5697.

Referring to FIG. 5, the existence of sub-gaps (refer to reference number 521 and 531) having a binding energy less than 2 eV except the main gaps having a binding energy (or an energy gap) of approximately 6 eV is seen in photoemission spectrums of $VO_2$ (refer to reference number 520) and $V_2O_3$ (refer to reference number 530), which are Mott-Brinkman-Rice insulators that show a rapid transition to metals according to hole doping as described with reference to FIG. 4. However, the photoemission spectrum (refer to reference number 510) of $V_2O_5$ that does not generate an abrupt MIT by the hole doping shows only a main gap but no sub-gap is observed at a binding energy level less than 2 eV. This result indicates that a material that generates an abrupt MIT has a sub-gap at a binding energy less than 2 eV. This is an aspect of the Mott-Brinkman-Rice insulator and also an aspect of a semiconductor.

Figure 6:
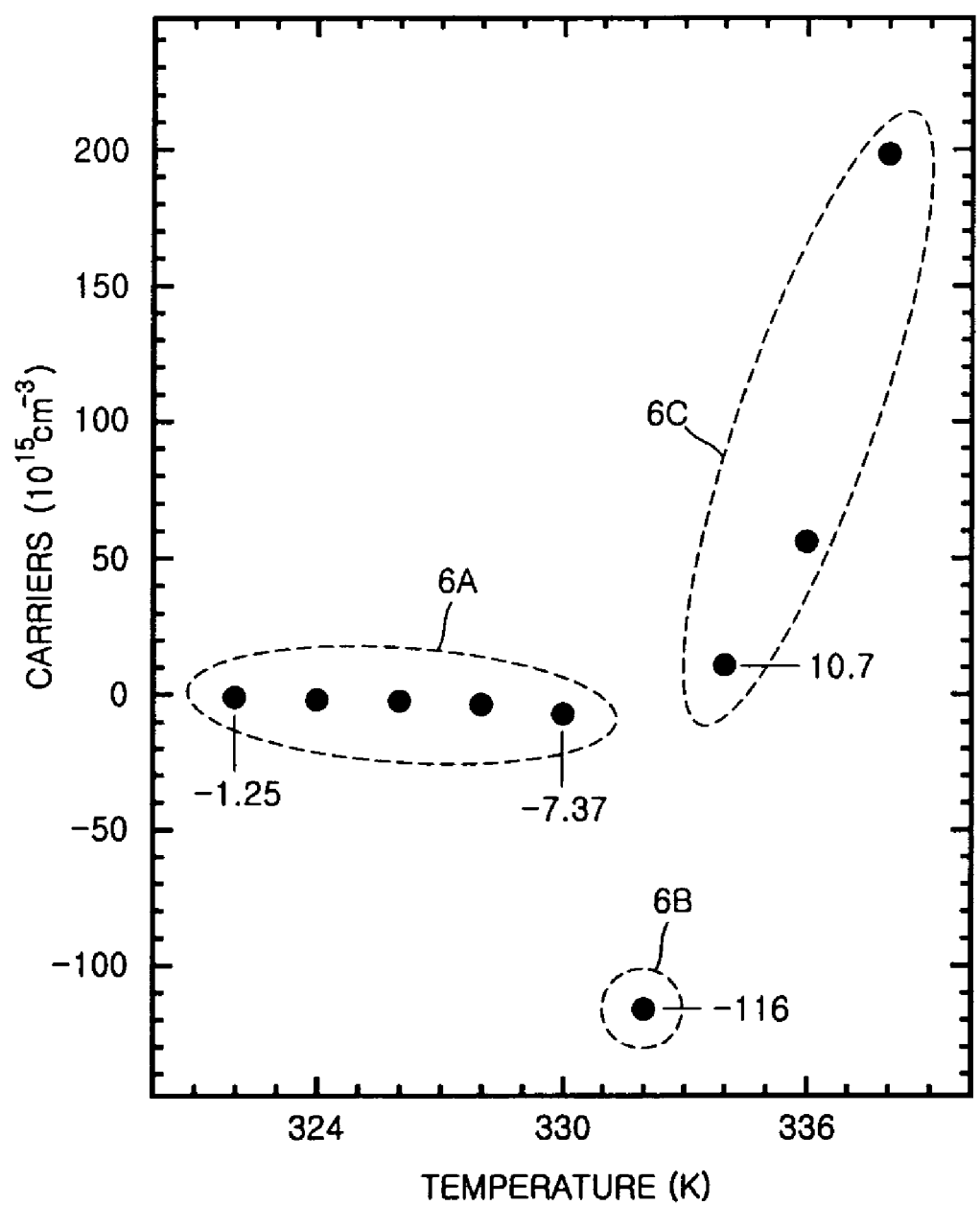
FIG. 6 is a graph for explaining the change of carriers according to temperature in the abrupt MIT semiconductor material of FIGS. 1 and 2.

FIG. 6 is a graph showing the result of a hall effect for explaining the change of carriers according to temperature in the abrupt MIT semiconductor material of FIGS. 1 and 2.

Referring to FIG. 6, the hole concentration ranges approximately $1.25 \times 10^{15}/cm^3 - 7.37 \times 10^{15}/cm^3$ at a temperature below 332 K (refer to FIG. 6A). The symbol "-" in FIG. 6 indicates holes. The holes showing the concentration in the range of $1.25 \times 10^{15}/cm^3 - 7.37 \times 10^{15}/cm^3$ exist in the valence band. However, in fact, a small amount of unmeasured exists in the hole level besides the hole in the valence band. The holes in the hole level appear as the temperature increases and approximately $1.16 \times 10^{17}/cm^3$ of the holes are measured when the temperature increases to approximately 332 K (refer to FIG. 6B). If the temperature further increases, a number of electrons are measured, and the number of electrons drastically increases as the temperature further increases (refer to FIG. 6C). Consequently, when the temperature of the Mott-Brinkman-Rice insulator increases, holes in the hole level are measured at a temperature of approximately 332 K, and if the temperature further increases, the Mott-Brinkman-Rice insulator rapidly transitions to a metal. The temperature dependence of the hole is also an aspect of a semiconductor.

Figure 7:
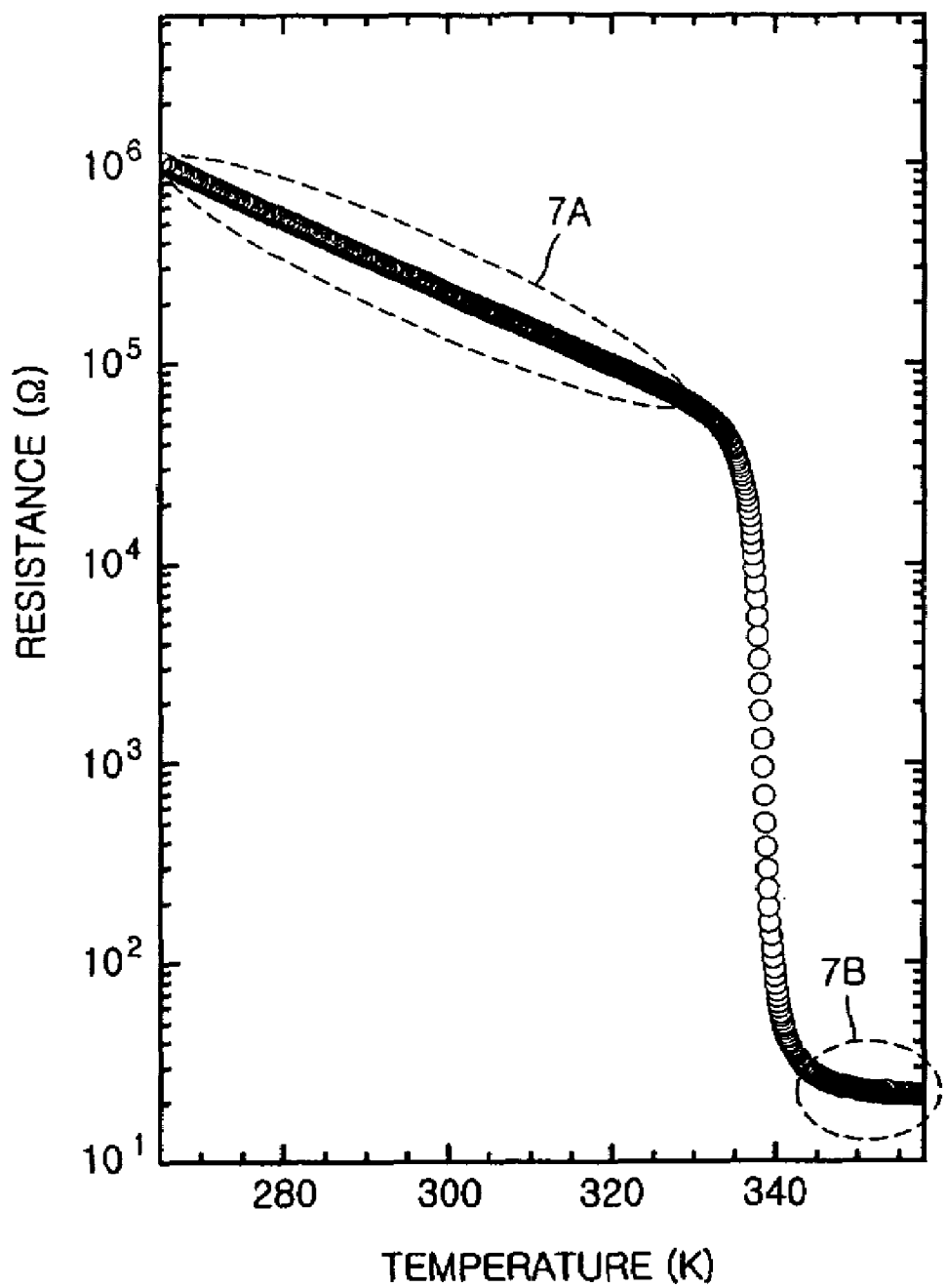
FIG. 7 is a graph showing the change of resistance according to temperature in the abrupt MIT semiconductor material of FIGS. 1 and 2.

FIG. 7 is a graph showing the change of resistance according to temperature in the abrupt MIT semiconductor material of FIGS. 1 and 2.

Referring to FIG. 7, resistances according to temperature changes are measured after forming a $VO_2$ layer, which is a Mott-Brinkman-Rice insulator, on a sapphire ($Al_2O_3$) (crystal face is 1102) substrate. The results show that the $VO_2$ layer remains in a semiconductor state (refer to 7A in FIG. 7) that has relatively high resistance values at temperatures below 332 K, generates a rapid transition to a metal at a temperature of approximately 332 K, and reaches a metal state (refer to 7B in FIG. 7) that has relatively low resistance values at temperatures greater than approximately 340 K. This result is identical to the result described with reference to FIG. 6 in that the semiconductor rapidly transitions to a metal as the result of hole doping according to temperature change. The exponential reduction of resistance according to the temperature increase in region 7A is an aspect of a semiconductor.

Figure 8:
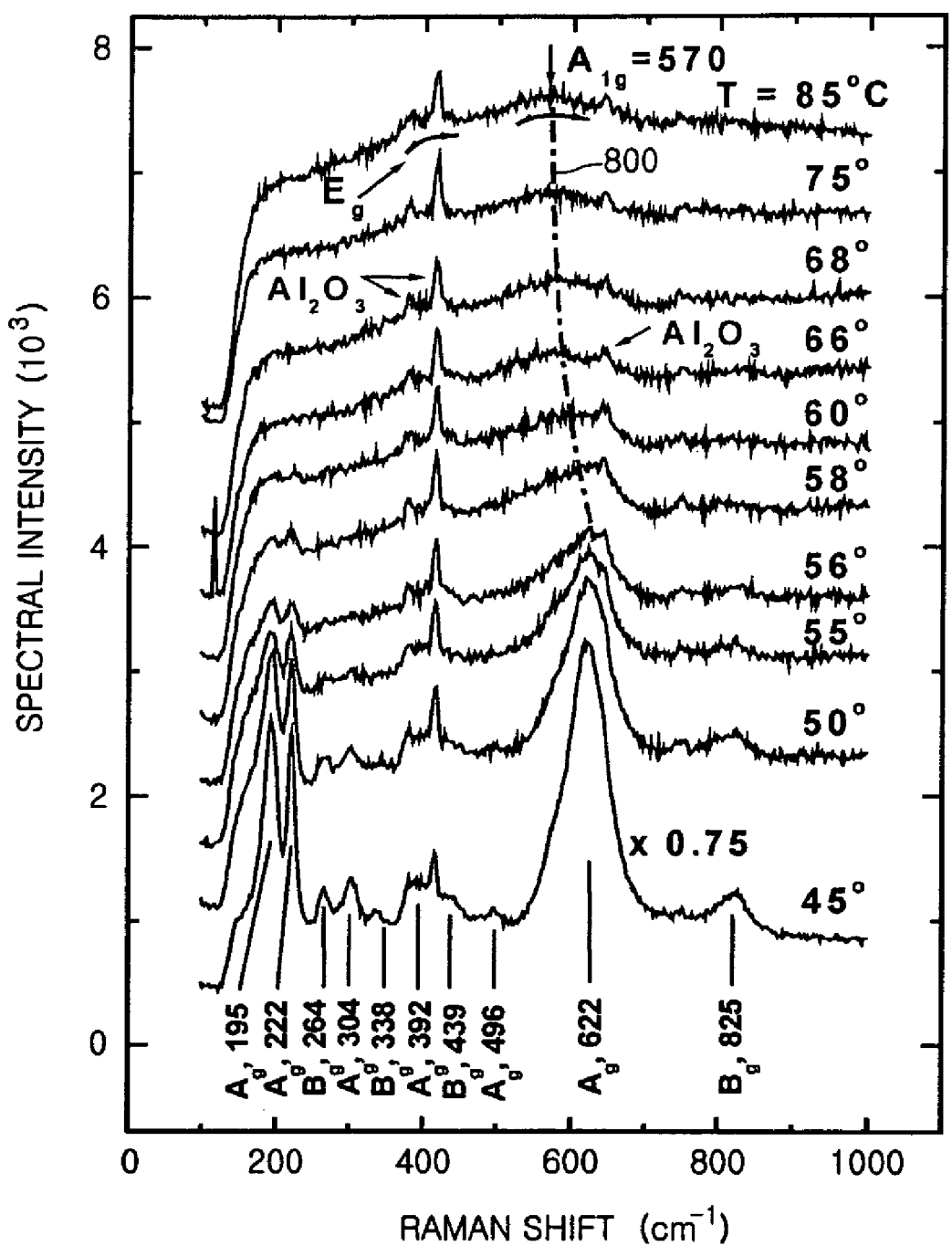
FIG. 8 is a graph showing the test results of Raman scattering for observing the structural change of a material according to temperature change.

FIG. 8 is a graph showing the test results of Raman scattering for observing the structural change of a material according to a temperature change. In FIG. 8, x-axis and y-axis respectively represents a Raman shift and the intensity of spectrum.

Referring to FIG. 8, when the temperature of a structural phase transition changes from a low temperature to a high temperature, that is, from 45° C. to 85° C., the location of an atom also changes. More specifically, as a dotted line indicated by the reference number 800, an $A_g$ peak of the largest monoclinic structure at 622 cm$^{-1}$ at a temperature of 45° C. is changed to an $A_{1g}$ peak of a wide tetragonal structure at 570 cm$^{-1}$ at temperature of 85° C. Therefore, it can be seen that the location of an atom can vary according to the change of peak location that represents the polarization of an atom at a particular location. The location change of an atom means that a structural phase transition was generated, and accordingly, a structural phase transition can be generated by the temperature change.

Figure 9:
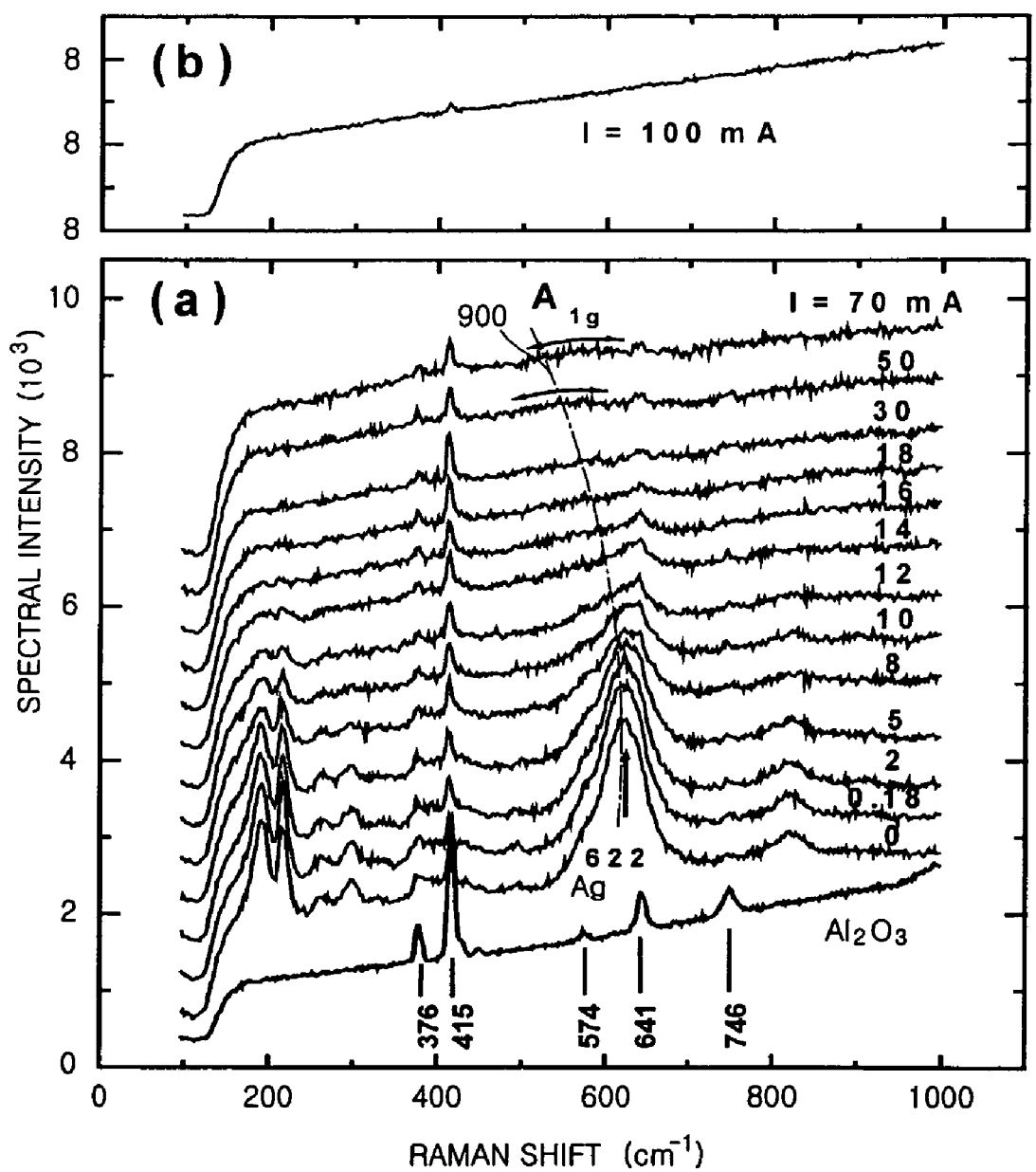
FIG. 9 is a graph showing the test results of micro Raman scattering with respect to the abrupt MIT semiconductor material of FIGS. 1 and 2 for observing the structural change of a material according to current change.

FIG. 9 is a graph showing the results of spectroscopic micro Raman scattering tests in an abrupt MIT semiconductor with respect to $VO_2$, which is an abrupt MIT semiconductor material of FIGS. 1 and 2, for observing the structural change of a material according to current change.

Referring to (a) in FIG. 9, in the case of the $VO_2$ layer on a sapphire ($Al_2O_3$) substrate (crystal face is 1102), when observing the location change of a peak indicated as reference number 900, the $A_g$ peak of the monoclinic at 622 cm$^{-1}$ is not changed until the current flow in the $VO_2$ layer reaches 18 mA and disappears above 18 mA. This indicates that the structural phase transition is not generated below 20 mA. Peaks that exist above 16 mA are the peaks of $Al_2O_3$ of the substrate. The location change of atoms, which indicates the generation of a structural phase transition, occurs and the $A_{1g}$ peak, which indicates a wide tetragonal structure, appears above the current flow of approximately 30 mA. This means that the structural phase transition is generated above 30 mA. However, it will be described with reference to FIG. 11 later on, the fact that the current flow in the $VO_2$ layer is approximately 5 mA means that a rapid transition to a metal has been generated by hole doping in the $VO_2$ layer. This proves that the structural phase transition by a rapid transition to a metal by hole doping is not generated. The structural phase transition when a current flows greater than approximately 30 mA is a phenomenon that takes place by heat generated by a current that flows in the $VO_2$ layer and is not directly related to the rapid transition to a metal by hole doping. Consequentially, the rapid transition to a metal by hole doping is different from the structural phase transition. This structural phase transition is a secondary phenomenon.

Referring to portion (b) in FIG. 9, when the current flow in the $VO_2$ layer is approximately 100 mA, the measurement of the location change of atoms is difficult because the Raman shift peaks are screened by a lot of currents. This proves that the $VO_2$ layer has a metal characteristic.

Figure 10:
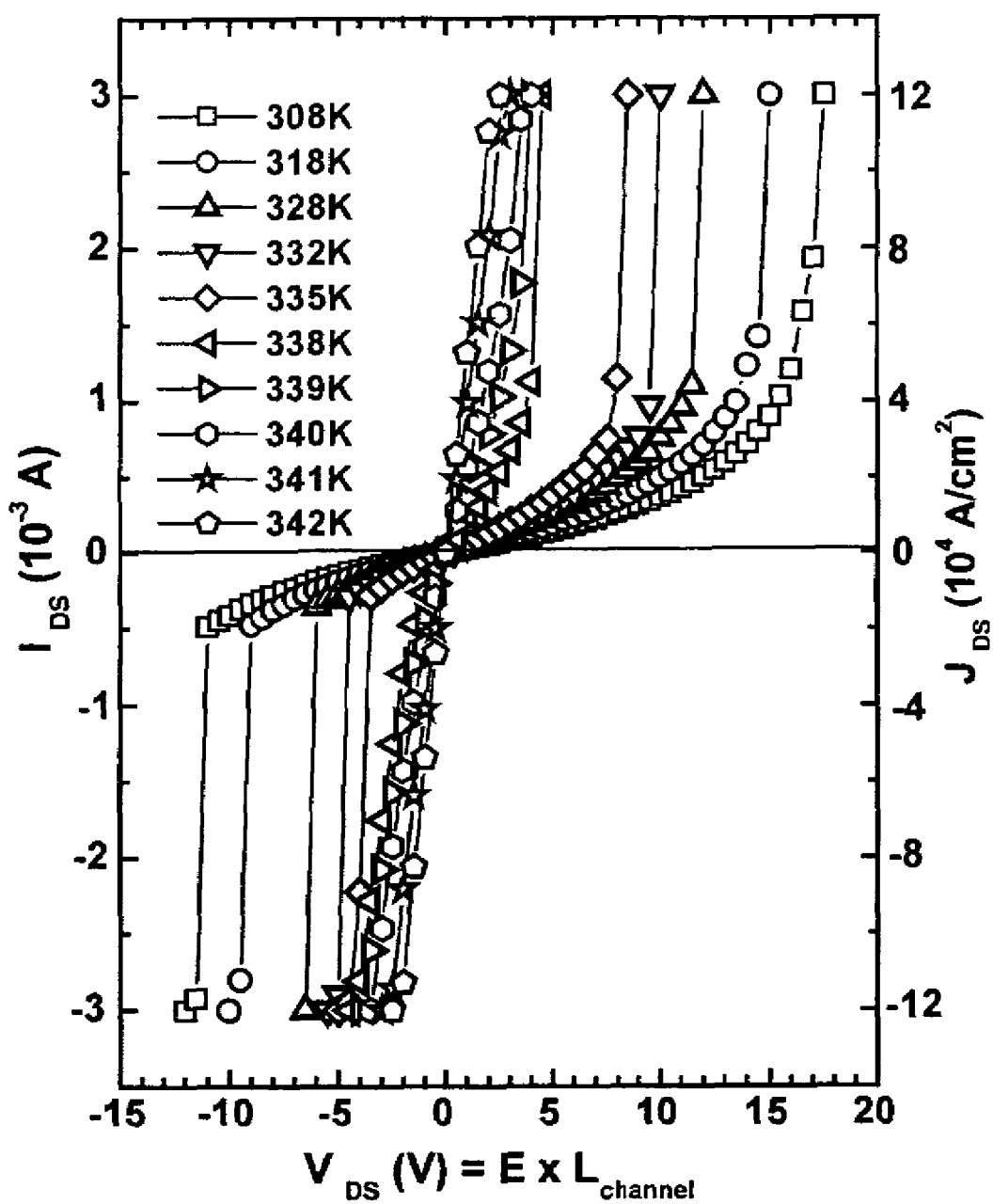
FIG. 10 is a graph showing the characteristic of voltage-current of the abrupt MIT semiconductor material of FIGS. 1 and 2 according to temperature change.

FIG. 10 is a graph showing the characteristic of voltage-current of the abrupt MIT semiconductor material of FIGS. 1 and 2 according to temperature change. The x-axis in FIG. 10 represents a drain-source voltage VDS applied to both ends of the $VO_2$ layer on a sapphire ($Al_2O_3$) substrate (crystal face is 1102) and the y-axis represents a current IDS and current density JDS that flows on both ends of the $VO_2$ layer. The length of the both ends of the $VO_2$ layer, that is, the channel length is 5 μm.

Referring to FIG. 10, a rapid transition to a metal takes place at a temperature lower than the temperature of approximately 338 K at which the structural phase transition generates at a drain-source voltage $V_{DS}$. As the temperature increases, the drain-source voltage VDS, at which a rapid transition to a metal takes place, is decreased. At a higher temperature than 338 K (65° C.), that is, when the structural phase transition has already occurred by a temperature change, the abrupt MIT semiconductor material satisfies the ohm's law. Consequentially, the rapid transition to a metal takes place at a lower temperature than a temperature at which the structural phase transition generates. Therefore, there is no direct relation between the structural phase transition and the rapid transition to a metal. The structural phase transition takes place due to the temperature increase of the device by an excessive current after the metal-insulator transition. This denotes that the metal-insulator transition indirectly affects the structural phase transition.

Figure 11:
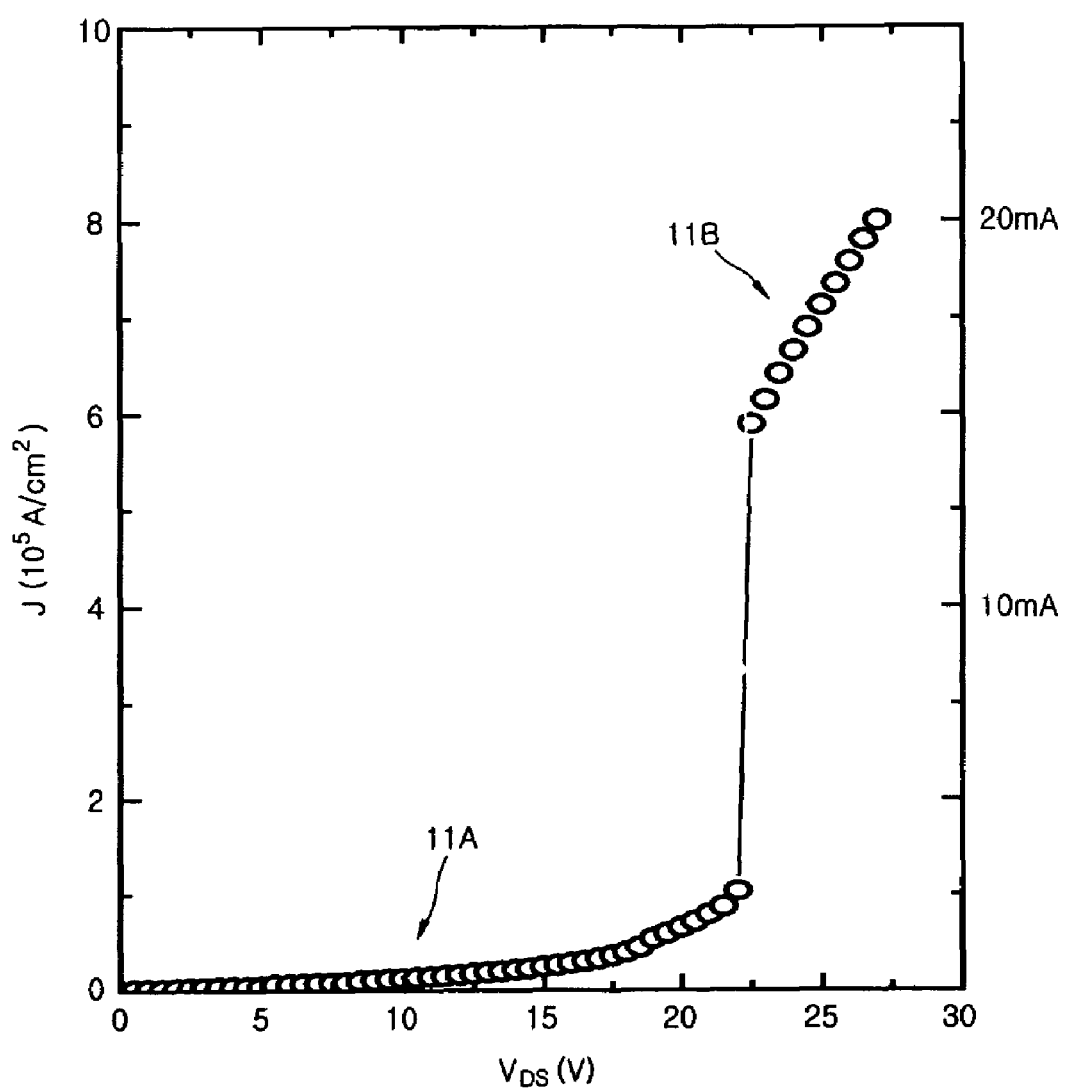
FIG. 11 is a graph showing the voltage-current characteristic in the 2-terminal network circuit of FIG. 3.

FIG. 11 is a graph showing a voltage-current characteristic in the 2-terminal network circuit of FIG. 3. In FIG. 11, the semiconductor device of a plane structure of FIG. 2 is used as the 2-terminal semiconductor device that uses an abrupt MIT semiconductor material. More specifically, a sapphire ($Al_2O_3$) layer is used as the substrate, the $VO_2$ layer is used as the abrupt MIT semiconductor material, a two layer of Au/Cr is used as the first and second electrodes, and the channel length of the $VO_2$ layer between the first and the second electrodes is 5 μm. The resistance unit has a resistance value of 1 kΩ.

Referring to FIG. 11, the $VO_2$ layer maintains an insulating state (refer to 11A) until the drain-source voltage $V_{DS}$ of approximately 22.5 V applied between the first electrode and the second electrode, but at a higher voltage than 22.5 V, the VO$_2$ layer becomes a metal state (refer to 11B) by a rapid transition to a metal. This means that if a voltage of approximately 22.5 V is applied, that is, a field greater than a predetermined magnitude is applied to both ends of the VO$_2$ layer, and than an abrupt MIT is generated by hole doping. When the VO$_2$ layer is in a metal state (11B) from an insulating state (11A) by generating an abrupt MIT by hole doping, a current flows in the VO$_2$ layer and the magnitude of the current is greater than approximately 15 mA.

Figure 12:
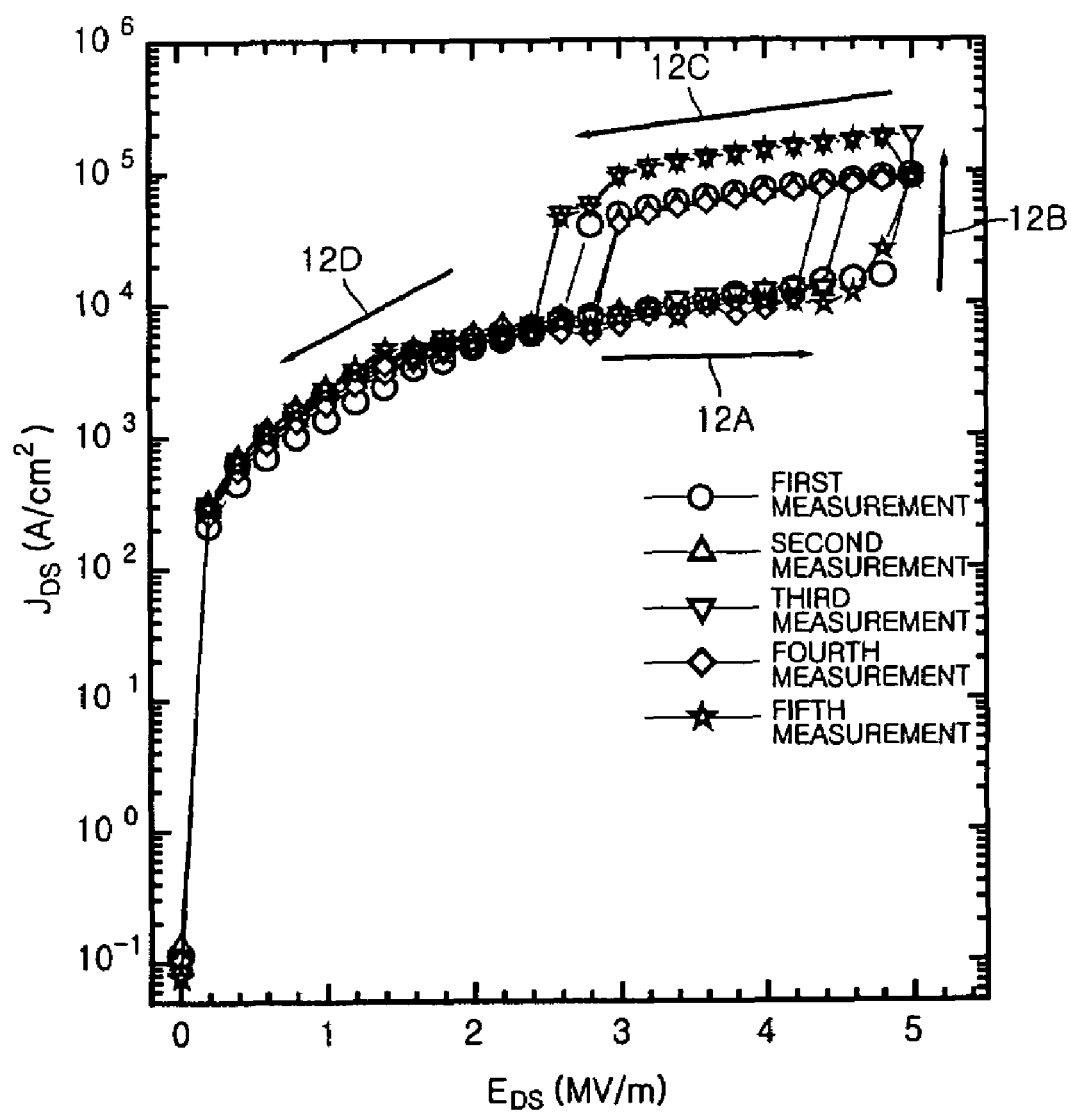
FIG. 12 is a graph showing the hysteresis characteristic of a metal state of the abrupt MIT semiconductor material of FIGS. 1 and 2.

FIG. 12 is a graph showing the hysteresis characteristic of a metal state of the abrupt MIT semiconductor material of FIGS. 1 and 2.

Referring to FIG. 12, from the measurement results of the current density change according to the variation of field EDS applied to both ends of the abrupt MIT semiconductor material, it is seen that there is a hysteresis characteristic in a metal state as the result of an abrupt MIT, that is, a characteristic of changing current density JDS sequentially as indicated by the arrows 12A→12B→12C→12D. This proves that hole doping causes an abrupt MIT when applying a field.

Figure 13:
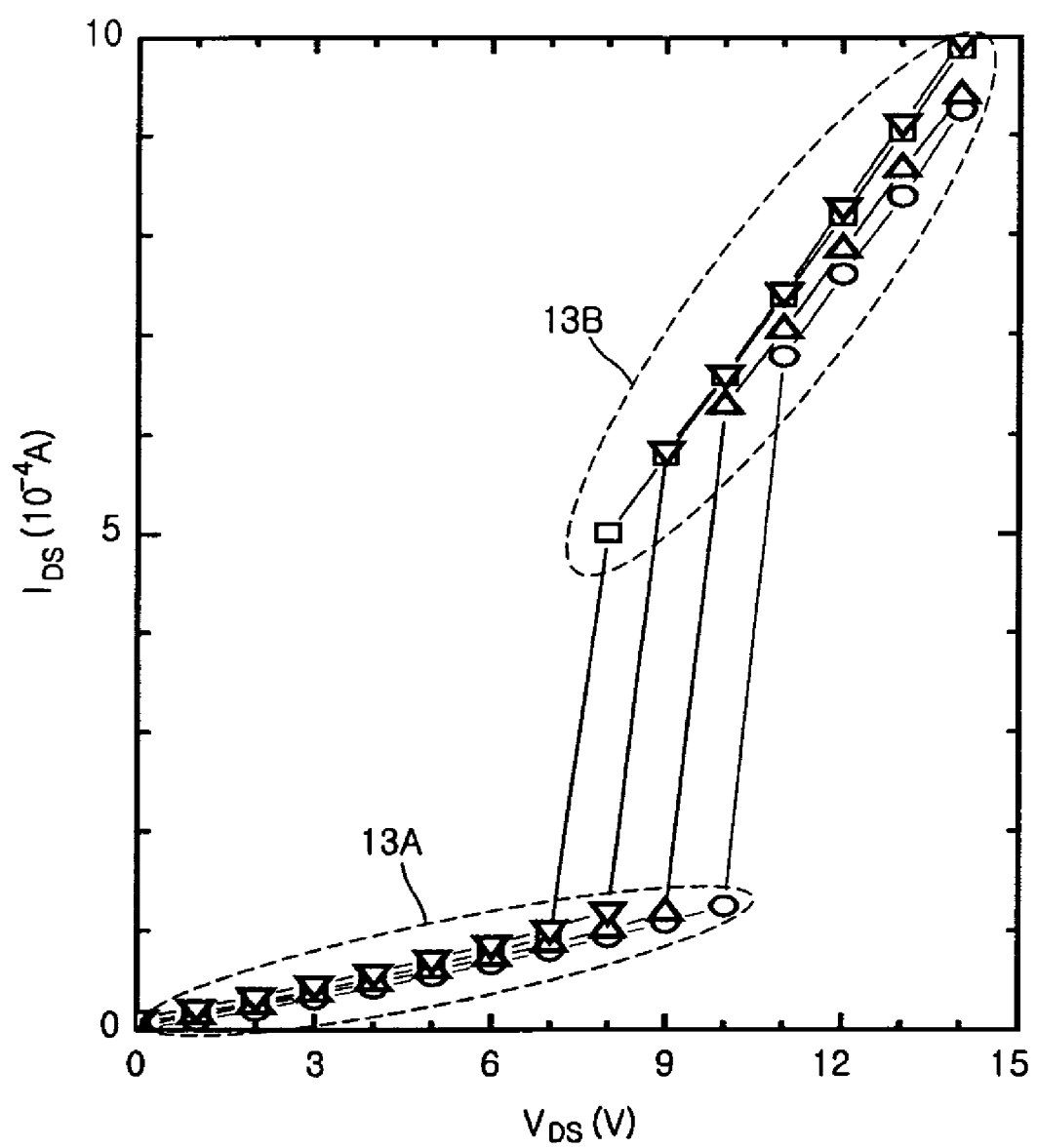
FIG. 13 is a graph showing the voltage-current characteristic in a 2-terminal semiconductor device that uses a vanadium dioxide layer as an abrupt MIT semiconductor material.

FIG. 13 is a graph showing the voltage-current characteristic in a 2-terminal semiconductor device using a VO$_2$ layer as an abrupt MIT semiconductor material.

Referring to FIG. 13, in a semiconductor device that uses an abrupt MIT semiconductor material having a stacking structure of FIG. 1, if the VO$_2$ layer is used as the abrupt MIT semiconductor material, it is seen that the VO$_2$ layer has changed from an insulator state (13A) to a metal state (13B) by an abrupt MIT by hole doping as the result of applying a predetermined voltage to both ends of the VO$_2$ layer.

Figure 14:
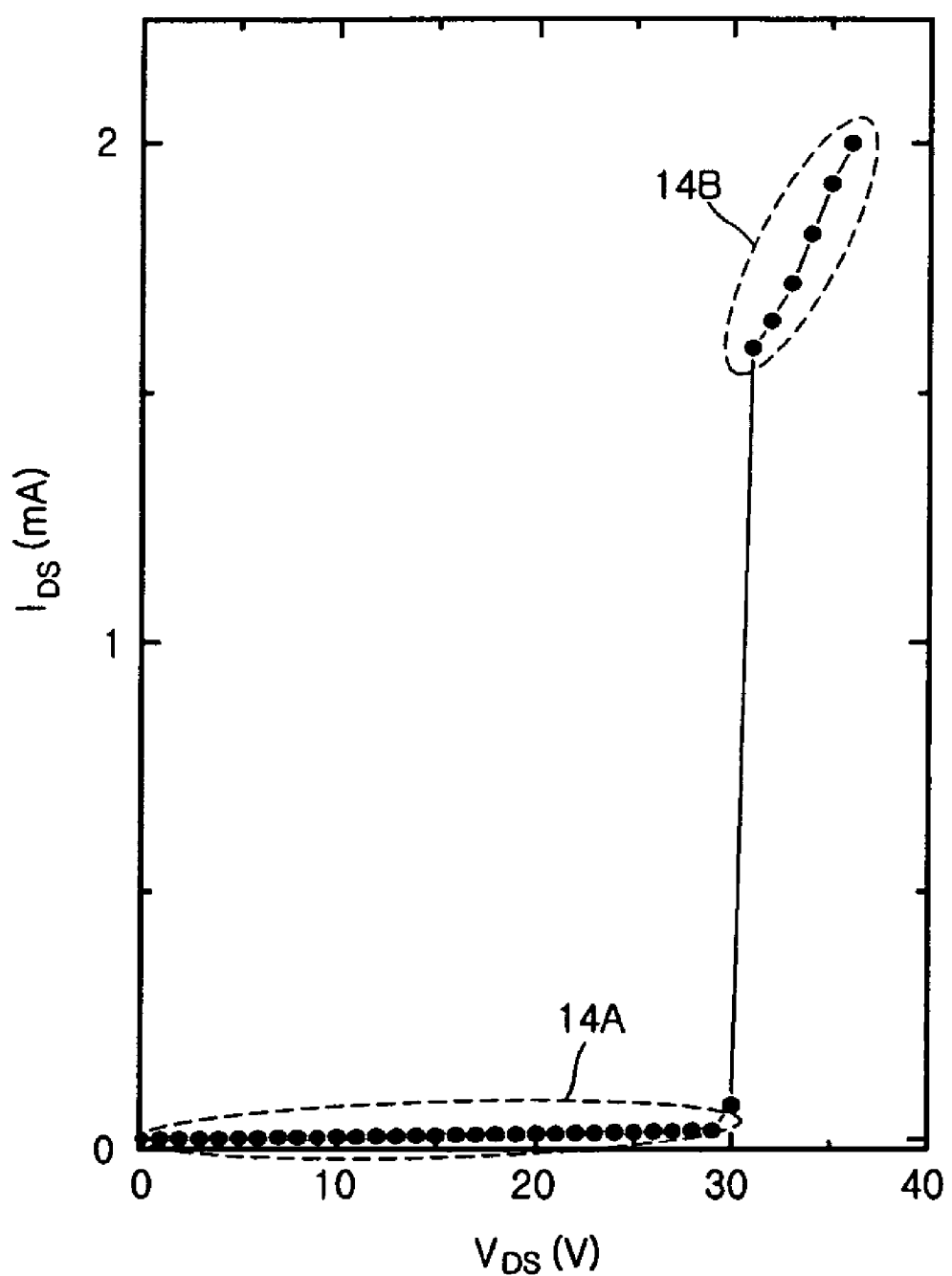
FIG. 14 is a graph showing the voltage-current characteristic in a 2-terminal semiconductor device that uses p-type gallium (Ga) arsenic (As) as an abrupt MIT semiconductor material.

FIG. 14 is a graph showing the voltage-current characteristic in a 2-terminal semiconductor device that uses p-type gallium arsenic (GaAs) as an abrupt MIT semiconductor material.

Referring to FIG. 14, as the result of applying a predetermined voltage V$_{DS}$ to both ends of a p-type GaAs layer after forming the p-type GaAs layer on a GaAs substrate, the GaAs layer has changed to a metal state (14B) from an insulator state (14A) by the generation of abrupt MIT by hole doping. Here, the p-type GaAs is a material having a sub-band less than 2 eV and holes in the hole level, and it is seen that the rapid transition to a metal has been generated by hole doping when applying a voltage of approximately 30 V. The low concentration hole when the abrupt MIT is generated is n≈0.001% 1×10$^{14}$ cm$^{-3}$ from n≈(0.2/a$_H$)$^3$.

Figure 15:
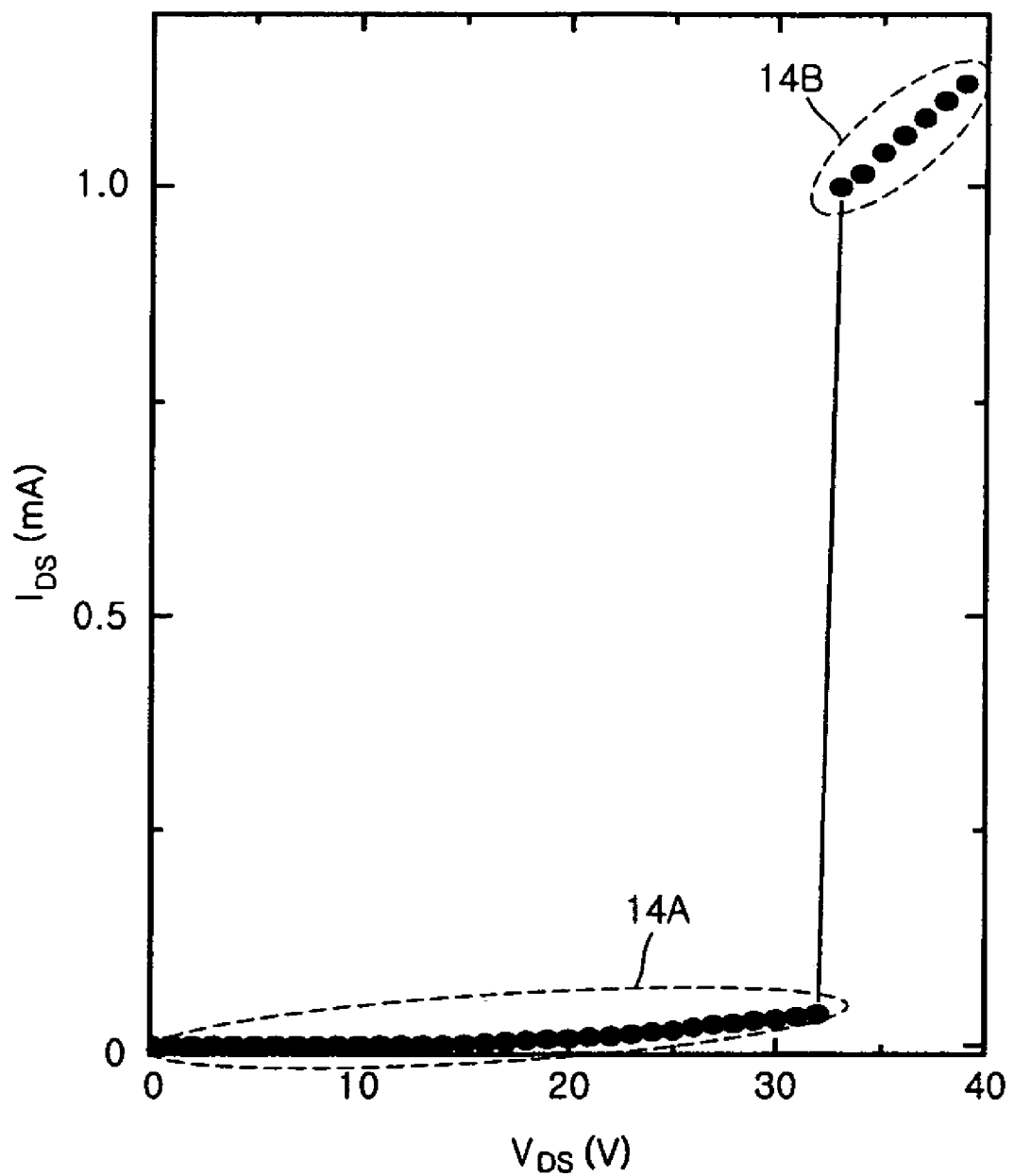
FIG. 15 is a graph showing the voltage-current characteristic in a 2-terminal semiconductor device that uses p-type GaAs as an abrupt MIT semiconductor material.

FIG. 15 is a graph showing the voltage-current characteristic in a 2-terminal semiconductor device that uses p-type GaAs as an abrupt MIT semiconductor material.

Referring to FIG. 15, in the case of forming an aluminum arsenic (AlAs) buffer layer between the GaAs substrate and the p-type GaAs layer, when applying a relatively high voltage comparing to the case without the AlAs buffer layer, it is seen that the insulator state (14A) has changed to a metal state (14B) by generating an abrupt MIT. However, the voltage difference is minute.

Figure 16:
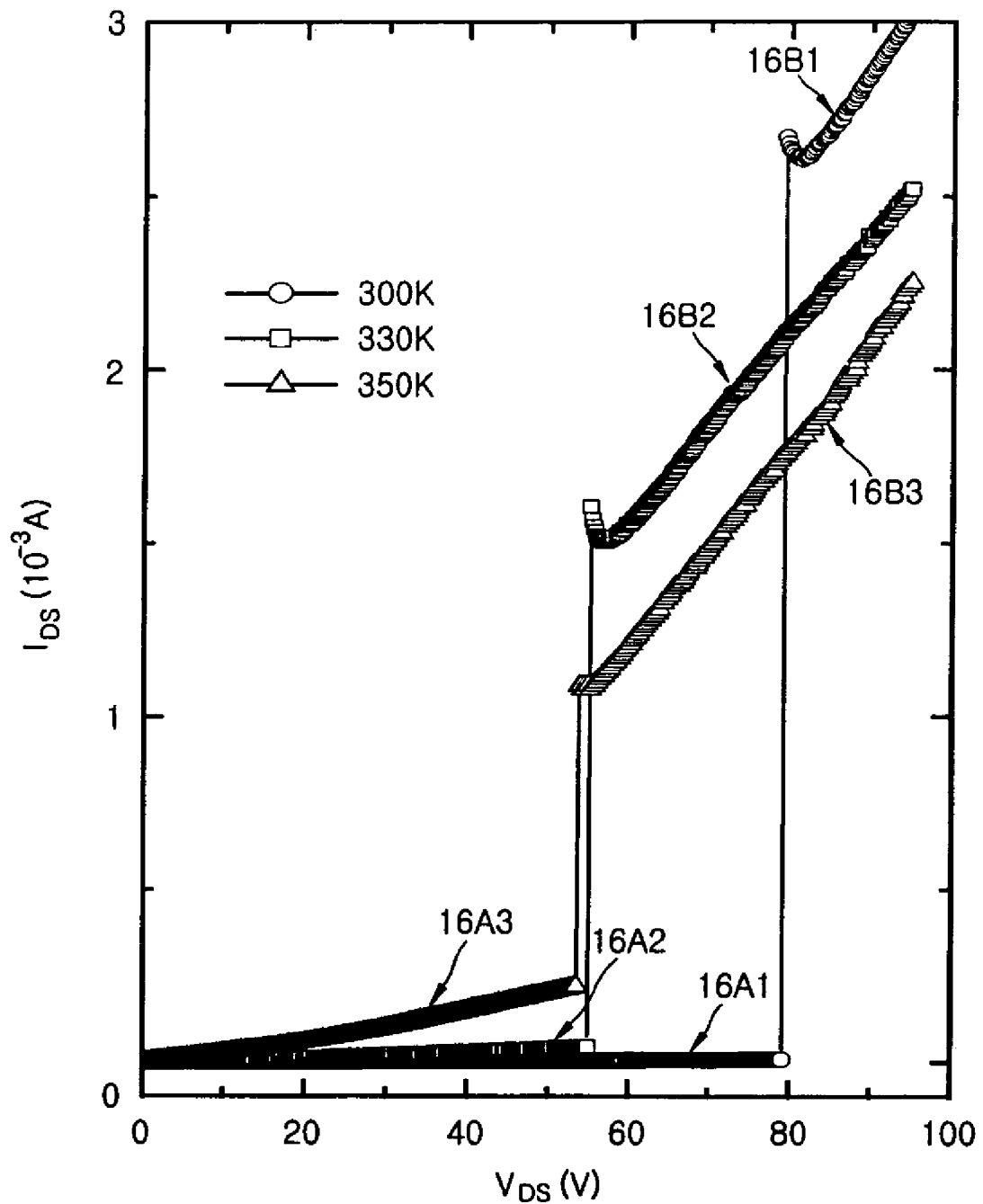
FIG. 16 is a graph showing the voltage-current characteristic according to temperature change in a 2-terminal semiconductor device that uses p-type GaAs as an abrupt MIT semiconductor material.

FIG. 16 is a graph showing the voltage-current characteristic according to temperature change in a 2-terminal semiconductor device that uses p-type GaAs as an abrupt MIT semiconductor material. Here, the channel length of the p-type GaAs is approximately 10 μm.

Referring to FIG. 16, in the case of forming a p-type GaAs layer on the GaAs substrate, the rapid transition of the p-type GaAs layer to a metal state (16B1) from an insulator state (16A1) is generated at a voltage of approximately 80 V and at a temperature of 300K which is relatively the lowest temperature. At a relatively high temperature of 330K, the abrupt MIT in the p-type GaAs layer from an insulator state (16A2) to a metal state (16B2) is generated at a voltage of approximately 55V. At a relatively high temperature of 350K, the p-type GaAs layer changes from an insulator state (16A3) to a metal state (16B3) at a voltage of approximately 53 V. These results show a relation between a voltage applied for generating an abrupt MIT and temperature, and indicate that, consequentially, as the temperature increases, the applied voltage for generating an abrupt MIT is low, and there is no difference of voltages applied for generating an abrupt MIT above a certain temperature level.

Figure 17:
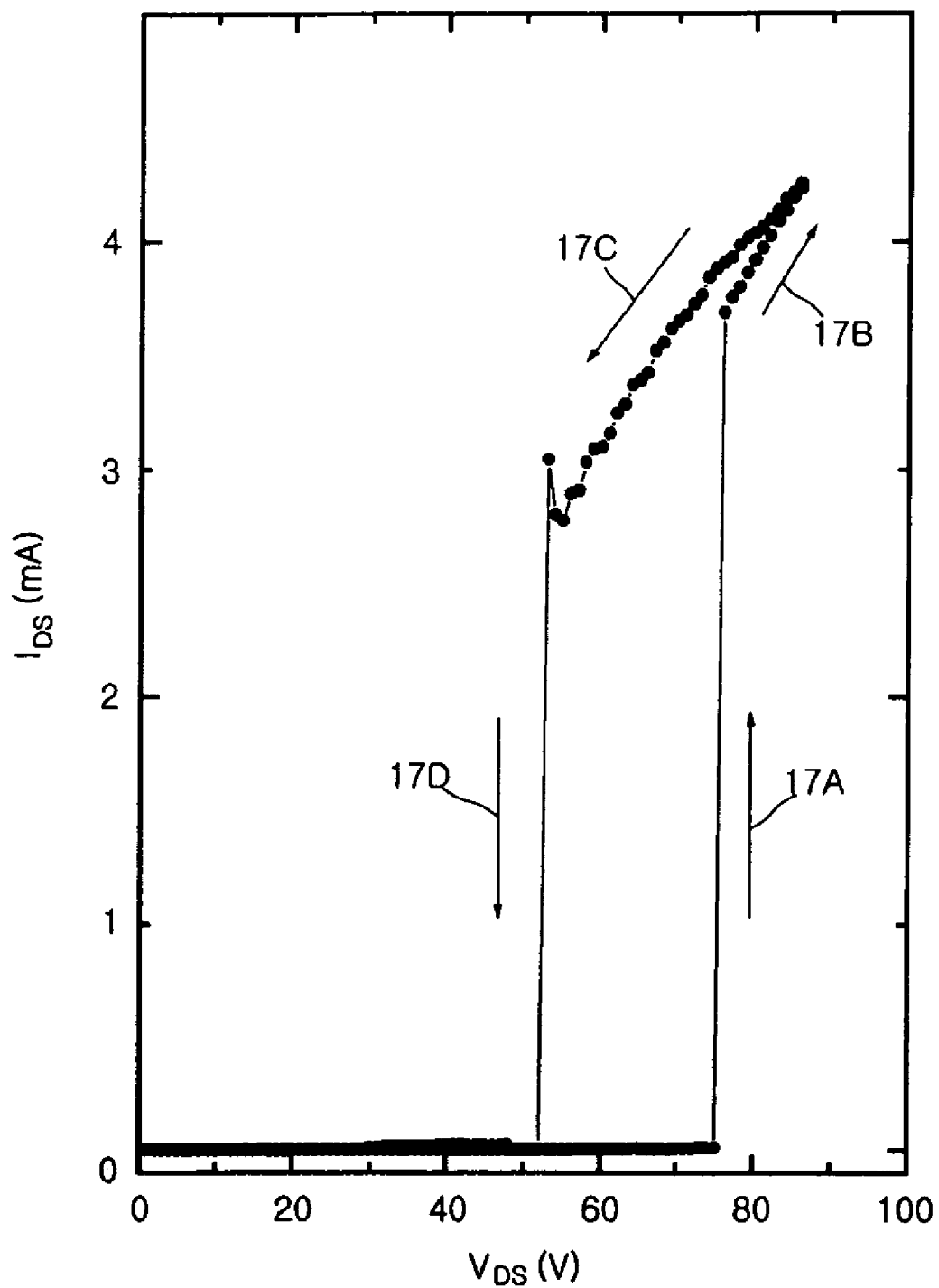
FIG. 17 is a graph showing the hysteresis characteristic of a metal phase of p-type GaAs as an abrupt MIT semiconductor material.

FIG. 17 is graph showing the characteristic of hysteresis of a metal phase of p-type GaAs as an abrupt MIT semiconductor material. Here, the channel length of the p-type GaAs is approximately 10 μm.

Referring to FIG. 17, the measurement results of current density J$_{DS}$ according to the variation of voltage V$_{DS}$ applied to both ends of an abrupt MIT semiconductor material show a hysteresis characteristic in a metal state as a result of generating an abrupt MIT, that is, the change of current density J$_{DS}$ sequentially as indicated by the arrows (17A→17B→17C→17D). This result proves that the abrupt MIT can be generated in the p-type GaAs by hole doping by applying a field.

Figure 18:
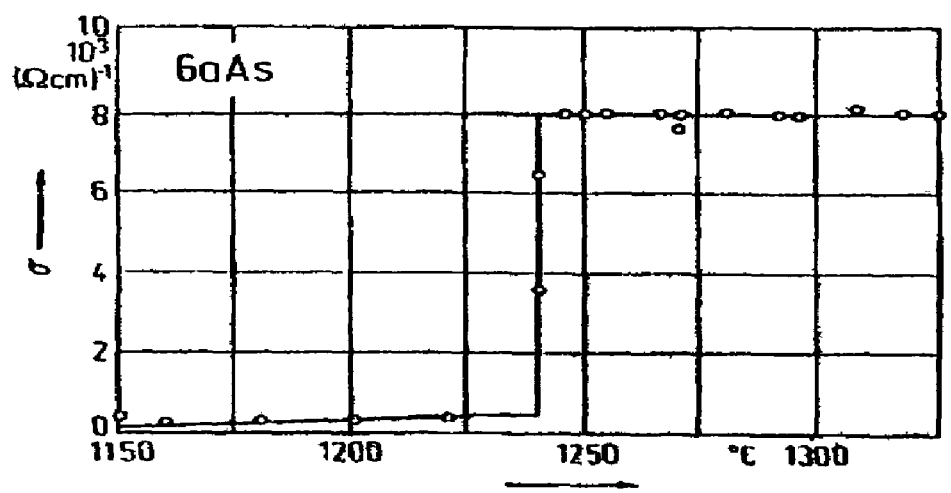
FIGS. 18A and 18B are graphs showing the temperature dependence of electric conductivity of GaAs and that of the resistance of a p-type GaAs thin layer in which a low concentration of holes are added, respectively.
Figure 18:
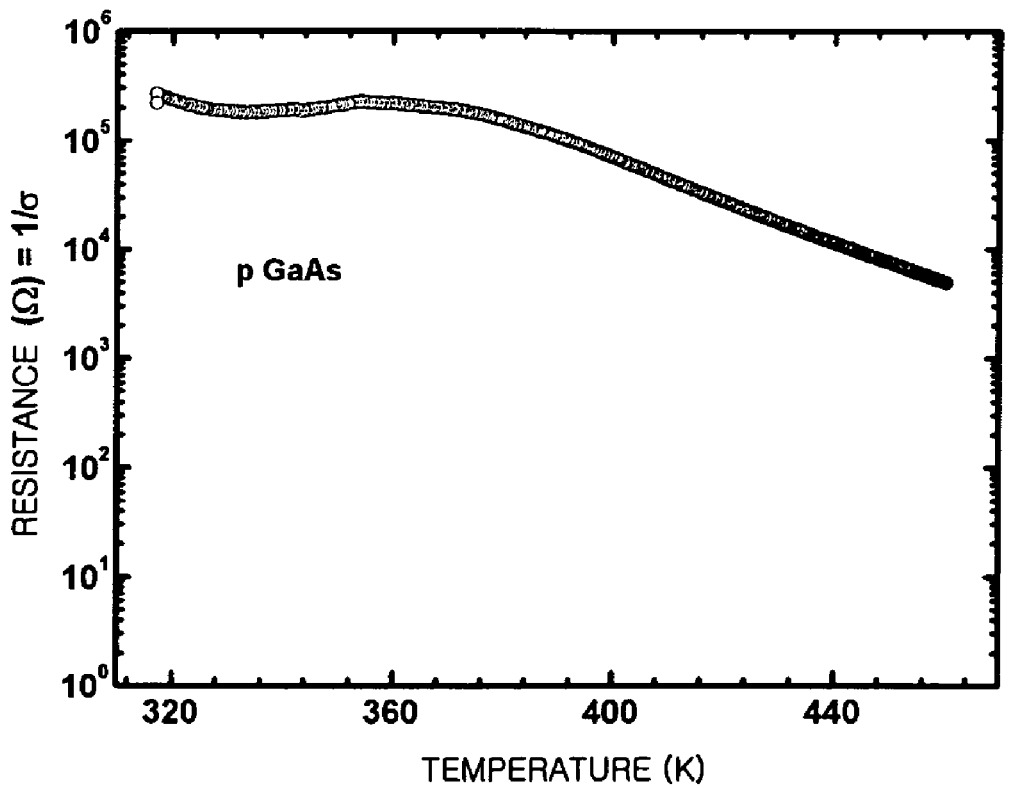

FIG. 18(a) is a graph showing the temperature dependence of electric conductivity of GaAs. These data are disclosed by G. Gattow and G. Buss and published in Naturwissenschaften 56 (1) (1969) 35. These data are quoted to show the temperature of structural phase transition of GaAs. FIG. 18(b) is a graph showing the temperature dependence of resistance of p-type GaAs to which a low concentration of holes is added. Resistance is inverse proportional to electric conductivity.

More specifically, FIG. 18(a) shows a line of rapid discontinuity of electric conductivity at temperature of approximately 1240° C. This result indicates that a structural phase transition from a monoclinic to a tetragonal structure is generated at a temperature below 1240° C. FIG. 18(b) shows the resistance of p-type GaAs, to which a low hole concentration of 5×10$^{14}$ cm$^{-3}$ is added, measured to temperature of 480K, and shows no abrupt MIT. Therefore, since the abrupt MIT observed in FIGS. 14, 15, 17, and at temperatures of 300K, 330K, and 350K in FIG. 16 are generated at a far lower temperature than the temperature of the structural phase transition, it can be said that the abrupt MIT observed in GaAs is not directly related to the structural phase transition.

Figure 19:
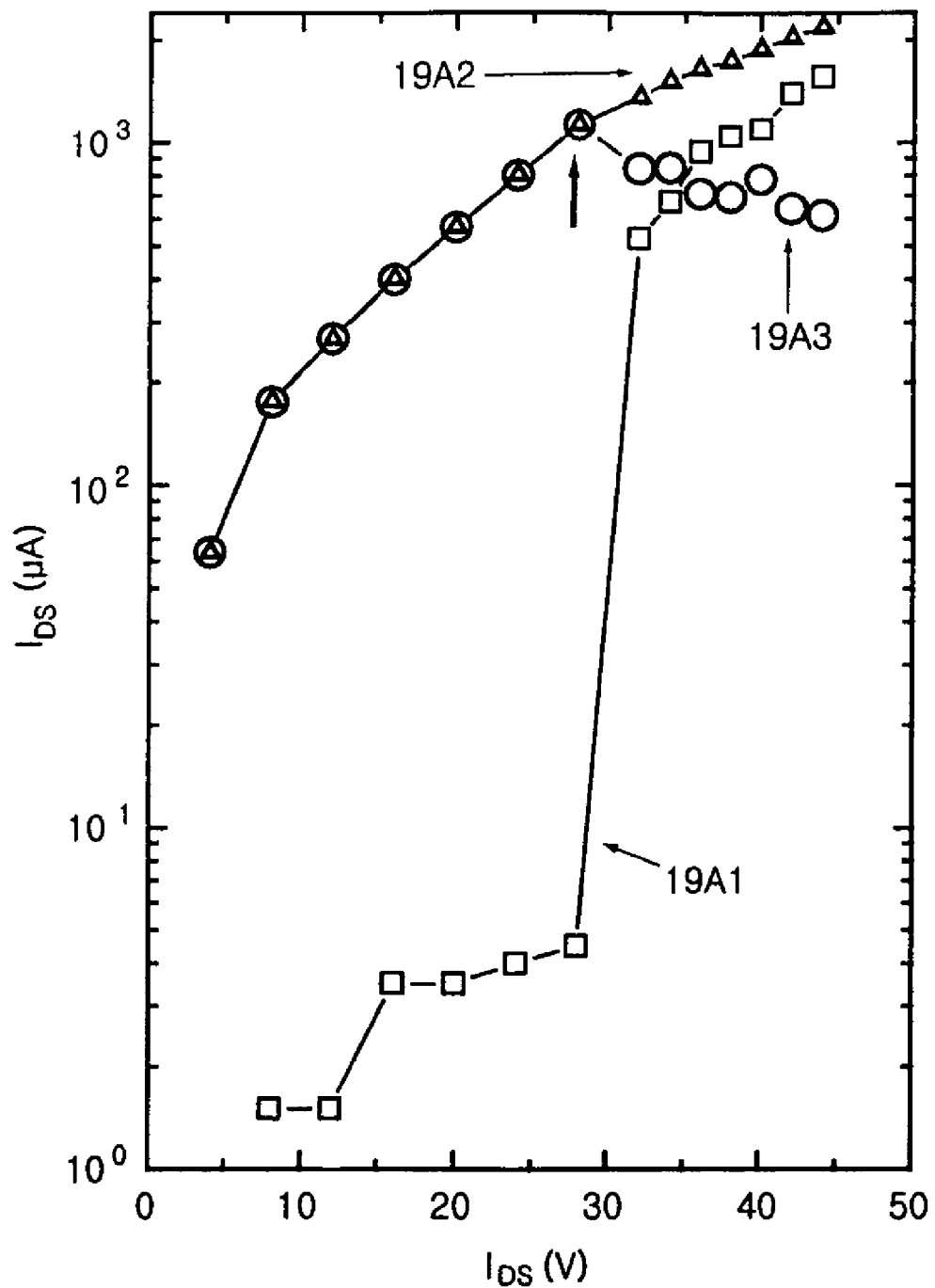
FIG. 19 is a graph showing the photocurrent characteristic measured using Ar ion laser of 514.5 nm in a 2-terminal semiconductor device that uses p-type GaAs as an abrupt MIT material.

FIG. 19 is a graph showing the characteristic of photocurrent measured using an Ar ion laser of 514.5 nm in a 2-terminal semiconductor device that uses p-type GaAs as an abrupt MIT material. Here, the channel length of the p-type GaAs is approximately 10 μm.

Referring to FIG. 19, the characteristic of photocurrent is defined by a difference between a measured current-voltage characteristic (19A2) while irradiating a laser and a measured current-voltage characteristic (19A1) without irradiating a laser. The characteristic of photocurrent is shown as a curved line "19A3." The curved lines "19A2" and the "19A3" overlap-type below the voltage of 27.5 V at which an abrupt MIT is generated in the curved line "19A1." This is because the difference of the curved lines between the "19A2" and the "19A1" is equal to the curved line "19A2" since the value of the curved line "19A1" is so small. This means that the magnitude of curved line "19A3" is almost identical to the photocurrent generated by hole carriers (photocurrent carrier) excited by a laser when irradiating the laser to p-type GaAs. Accordingly, the 2-terminal device of the present invention can be used as a photo sensor using the large photocurrent. A conventional photo sensor has a stack of tens of thin layer layers to increase the photocurrent effect. However, the use of the 2-terminal device of the present invention can simplify the structure. Moreover, when a radio frequency (RF) emitter is used instead of laser, the 2-terminal device like a photoelectric sensor can be used as a RF receiver. On the other hand, the reducing photocurrent characteristic above 27.5 V indicated by a curved line "19A3" is because the photoconductive characteristic is not generated in a metal. This is an aspect of an abrupt MIT.

Figure 20:
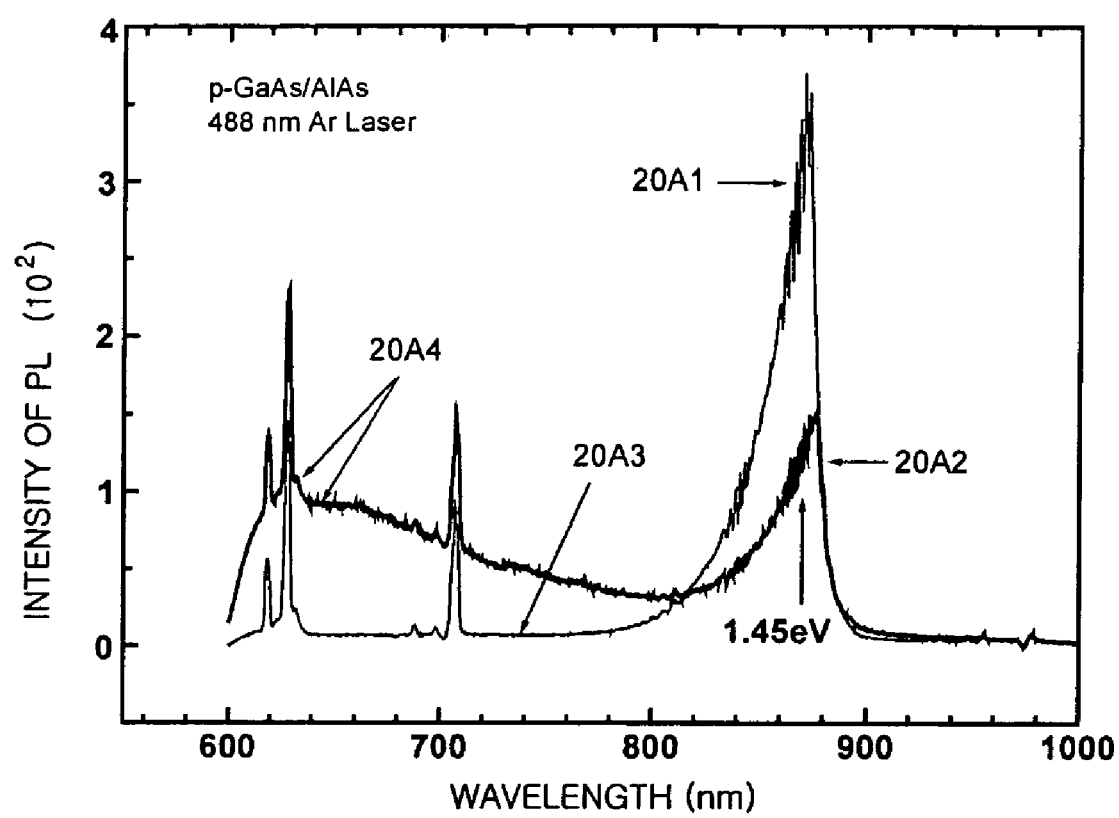
FIG. 20 is a graph of spectrum showing the intensity and wave dependence of fluorescent light emitted from a 2-terminal semiconductor device manufactured that uses p-type GaAs as an abrupt MIT semiconductor material by irradiating an Ar laser having a wavelength of 488 nm.

FIG. 20 is a graph of spectrums showing the intensity and wave dependence of photo-luminescence (PL) emitted from the 2-terminal semiconductor device of FIG. 2 manufactured that uses p-type GaAs as an abrupt MIT material and a buffer layer formed of AlAs by irradiating an Ar laser having a wave length of 488 nm.

Referring to FIG. 20, a graph indicated by a slim line represents a spectrum measured at 0V of electric field applied to the first and second electrodes, and a graph indicated by a thick line represents a spectrum measured at 34 V of electric field applied to the first and second electrodes. An abrupt MIT has been generated in the vicinity of 34V. The peak "20A1" corresponds to the sub-energy gap of GaAs having approximately 1.45 eV at a wavelength of 860 nm. This proves that the p-type GaAs is a semiconductor having an energy gap of less than 2 eV, to which holes are added. The intensity of sub-energy PL was rapidly reduced when a voltage of 34 V is applied between the first and second electrodes. However, the peak "20A2" indicates that a certain peak remains due to the existence of a material that does not generate an abrupt MIT. This is because that the p-type GaAs is mixed with a material that generates an abrupt MIT and a material that does not generate an abrupt MIT. The intensity of spectrum has increased consecutively from 800 nm to 600 nm after generating an abrupt MIT by applying an electric field. The sudden reduction of the spectrum curve toward short wavelengths from 600 nm is because the short wavelengths are removed using a filter. The increase in the intensity ("20A4") of PL from the wavelength of 800 nm to 600 nm is understood as a result of emitting light from the 2-terminal device. Light having a wavelength in the vicinity of 640 nm corresponds to red light. Therefore, the 2-terminal device of FIG. 2 can be used as a light-emitting device, such as a light emitting diode (LED) or a laser.

The phenomenon of consecutively increasing the intensity of PL from the wavelength of 800 nm to 600 nm is interpreted as a light emission by Bremsstrahlung radiation wherein electrons produced by the abrupt MIT generate electromagnetic waves of consecutive spectrum by accelerating the electrons in a strong electric field ($E=V/d_{channel\ length}=34V/5\ \mu m=6.8\times 10^6$ V/m). This is the same principle of an accelerator that generates a certain kind of light. The 2-terminal device can be considered as a super mini-accelerator having an acceleration length of 5 μm.

Figure 21:
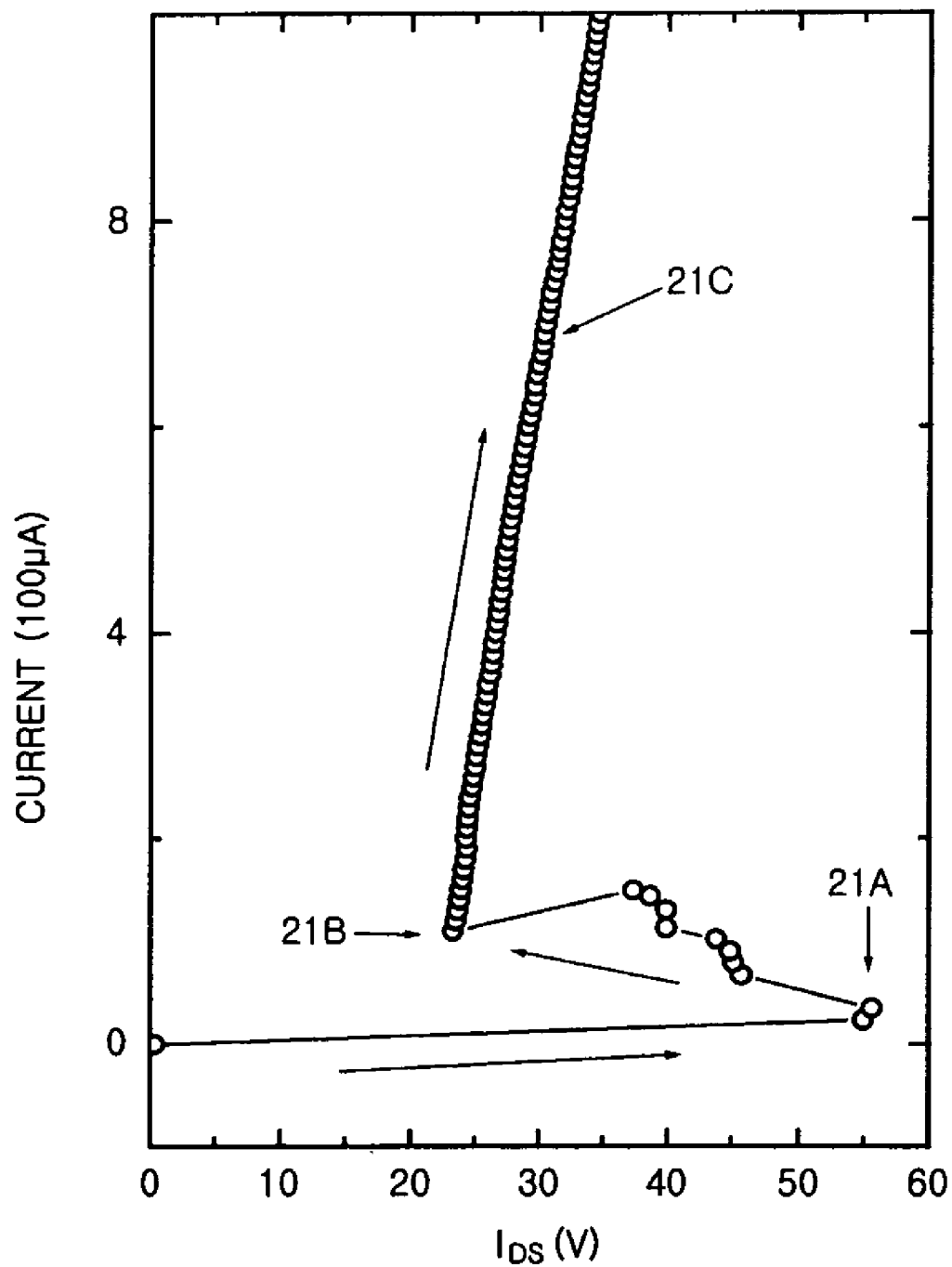
FIG. 21 is a graph showing a current-voltage characteristic measured by a current-control method that measures voltage by flowing current in a 2-terminal device that uses p-type GaAs as an abrupt MIT material.

FIG. 21 is a graph showing a current-voltage characteristic measured by a current control method that measures voltage with a current flow of 10 μA in a 2-terminal device that uses p-type GaAs as an abrupt MIT material. Here, the channel length of p-type GaAs is approximately 10 μm.

Referring to FIG. 21, when a current of 10 μA is applied for the first time, a voltage of 55 V (21A) is measured. Next, when the current is increased by 10 μA for each time, the voltage decreases discontinuously to approximately 25 V (21B). When the current is further increased, the voltage increases by the Ohm's law. The discontinuous reduction of measured voltages from 55V (21A) to 25V (21B) corresponds to an abrupt MIT because a straight line "21C", which shows the Ohm's law, indicates a metal characteristic. The phenomenon of decreasing and increasing voltage according to the increase of current is called a negative resistance or a negative differential resistance. The detection of a negative characteristic in a semiconductor to which a low concentration of hole, such as p-type GaAs, is injected is an aspect of a phase change memory. This means that p-type GaAs can be used as a material for forming a nonvolatile memory. Also, all semiconductor materials to which a low concentration of hole is added may show a negative resistance characteristic.

Figure 22:
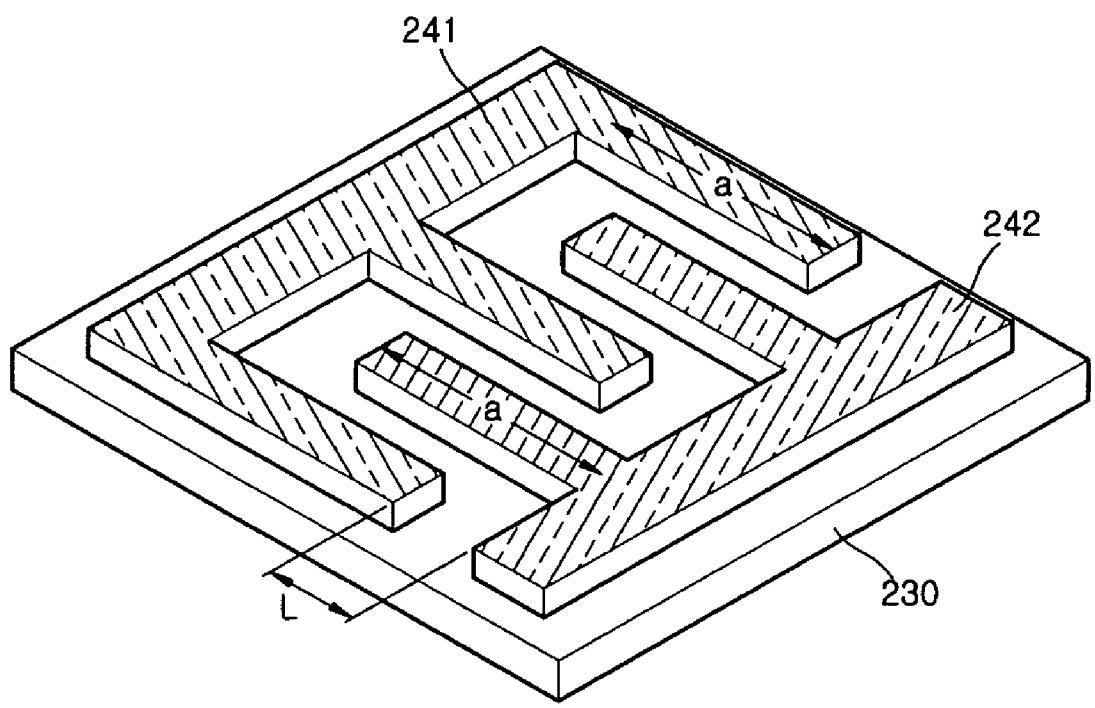
FIG. 22 is a perspective view illustrating an example of an electrode shape of the 2-terminal semiconductor device in FIG. 2.

FIG. 22 is a perspective view illustrating a shape of an electrode of the 2-terminal semiconductor device in FIG. 2.

Referring to FIG. 22, if the first and the second electrodes 241 and 242 have a plane structure facing each other on an abrupt MIT semiconductor material layer 300, the length of surface facing each other can be increased by forming the first and second electrodes 241 and 242 in a finger shape, thereby the amount of current flow per unit area increases. In the drawing, even though the first electrode 241 is formed to have three fingers and the second electrode 242 is formed to have two fingers, the number of fingers can be increased. Also, the length of fingers and the horizontal distance L between the first electrode 241 and the second electrode 242 can be controlled as desired.

Figure 23A:
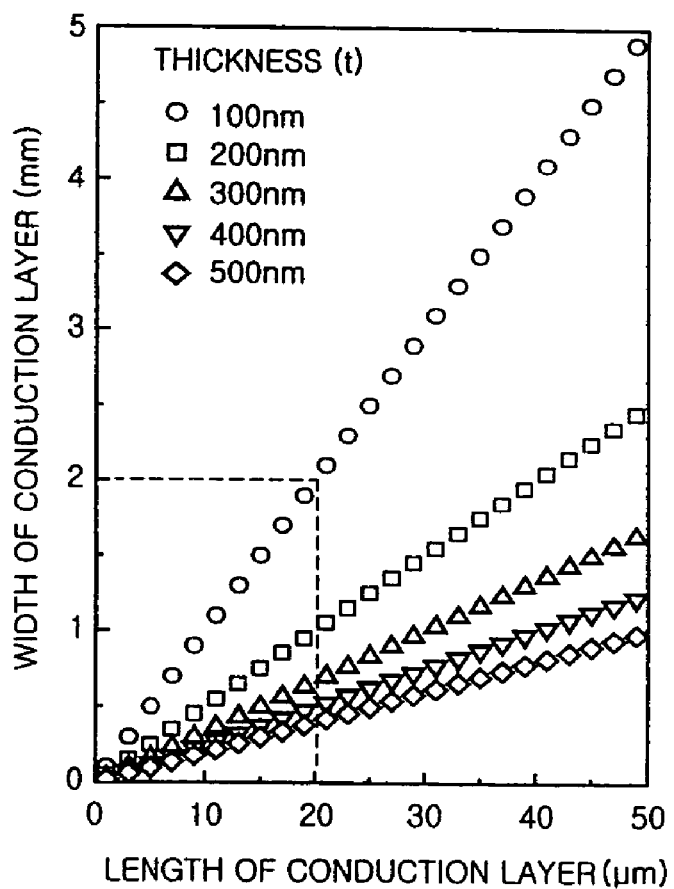
FIGS. 23A and 23B are a perspective view of an abrupt MIT semiconductor material and a graph showing a relationship-type of length and width according to the thickness change of the abrupt MIT semiconductor material of FIGS. 1 and 2, respectively.
Figure 23B:
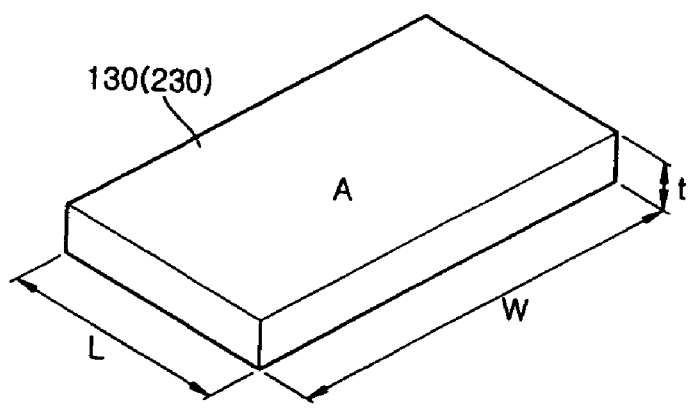

FIGS. 23A and 23B are respectively a perspective view of an abrupt MIT semiconductor material layer and a graph for explaining a relationship-type of length and width according to the variation of thickness of the abrupt MIT semiconductor material of FIGS. 1 and 2.

Referring to FIGS. 23A and 23B, a width W, a length L, a thickness t, and an area A of an abrupt MIT semiconductor material layer 130 or 230 must be harmonized from each other. That is, when a metal-insulator transition is generated at room temperature, in order to be able to have the resistance change approximately $10^4$ Ω before and after generating the transition, if the thickness of the thin layer is 100 nm, the length L is approximately 20 μm and the width W is approximately 3 mm as indicated by dotted lines in FIG. 23(B). Controlling the thickness t, the length L, and the width W can properly maintain a desired resistance change.

As described above, according to the 2-terminal semiconductor device that uses an abrupt MIT semiconductor material according to the present invention and the method of manufacturing the same, a device that can obtain a high current from a small area and can operate at a high speed can be manufactured by using the abrupt MIT semiconductor material by hole doping not by using a structural phase transition. The device can be applied to a variety of fields including a warning device, a temperature sensor, a switching device, a memory device, a cell protection circuit, a phase change memory, a magnetic memory which uses an abrupt MIT and a ferromagnetic thin layer, a photoelectric sensor, a high speed optical communication receiver, an RF detector, or a transistor, which requires a large current at an arbitrary temperature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A 2-terminal semiconductor device comprising:
   a first electrode layer as a substrate;
   an abrupt metal insulator transition (MIT) semiconductor organic or inorganic material layer, having an energy gap of less than 2 eV and holes in a hole level, disposed on the first electrode layer, wherein the abrupt MIT semiconductor material layer is operable to change from an insulator to a metal with a discontinuous jump without a structural phase transition by doping holes in the hole level at a low concentration and carriers of the abrupt MIT semiconductor material layer change from holes to electrons; and a second electrode layer disposed directly on the abrupt MIT semiconductor organic or inorganic material layer, wherein the 2-terminal semiconductor device is a switch device due to the discontinuous jumps, wherein the abrupt MIT semiconductor material layer includes at least one selected from inorganic compound semiconductors that include p-type semiconductors to which the low concentration of holes is added and p-type semiconductor elements (group-type III-V and II-VI) to which the low concentration of holes is added, and wherein the p-type semiconductor to which the low concentration of holes is added includes at least one selected from Si(100), Si(111), Si(110), Si:B, Si:P, Ge(100), SiC, SiGe, AlAs, InAlAs, AlSb, BN, GaAs, InGaAs, GaP, GaSb, $Ga_xSb_{1-x}$ ($0 \leq x \leq 0.5$), $Ge_xSb_{1-x}$ ($0 \leq x \leq 0.2$), InN, InAs, InP, InSb, $In_xSb_{1-x}$ ($0 \leq x \leq 0.5$), $Ge_aIn_b$-$Sb_cTe_d$ ($0 \leq a \leq 0.2$, $0 \leq b \leq 0.2$, $0.5 \leq c \leq 1$, $0 \leq d \leq 0.5$), $In_xSb_yTe_z$ ($0 \leq x \leq 0.2$, $0.5 \leq y \leq 1$, $0 \leq z \leq 0.3$), $Ag_aIn_b$-$Sb_cTe_d$ ($0 \leq a \leq 0.2$, $0 \leq b \leq 0.2$, $0.5 \leq c \leq 1$, $0 \leq d \leq 0.5$), $Te_aGe_bSn_cAu_d$ ($0.5 \leq a \leq 1$, $0 \leq b \leq 0.2$, $0 \leq c \leq 0.3$, $0 \leq d \leq 0.5$), $AgSbTe_2$, $AgInTe_2$, GeCdS, CdSe, CdTe, ZnS, ZnSe, ZnTe, PbS, PbSe, PbTe, Grey Sn, Grey Se, Sb, Te, $Sb_{1-x}Te_x$ ($0 \leq x \leq 0.5$), B, DAC (Diamondlike Amorphous-C), TAC (Tetrahedral Amorphous-C):N, a-C;H (Amorphous hydrogenated carbon layers, or DLC (Diamond-Like Carbon), Ga-As-Si system, Ga-GaAs-Ge system, Ga-GaAs-Sn system, Ga-As-Sn system, Ga-As-Zn system, Ga-P-Si system, Ga-P-Zn system, Ga-P-Ge system, GaP-Bi system, $GeTe-Bi_2Te_3$, $GeSb_2Te_4$, GaP:N, GaAs:Ca, GaAs:K, GaAs:Cl, and $GeBi_2Te_4$.

2. The 2-terminal semiconductor device of claim 1, wherein the first electrode layer and the second electrode layer include W, Mo, Au/Cr, Ti/W, Ti/Al/N, Ni/Cr, Al/Au, Pt, Cr/Mo/Au, $YBa_2Cu_3O_{7-d}$, or Ni/Mo/Au.

3. The device of claim 1, wherein the low concentration of the holes in the abrupt MIT semiconductor material layer is approximately $(0.2/a_H)^3$, where $a_H$ is a Bohr radius of the material.

4. The device of claim 1, wherein the abrupt MIT semiconductor material layer comprises a Mott-Brinkman-Rice insulator.

* * * * *